(12) United States Patent
Hatsuda

(10) Patent No.: US 11,508,424 B2
(45) Date of Patent: Nov. 22, 2022

(54) VARIABLE RESISTANCE MEMORY DEVICE

(71) Applicant: Kioxia Corporation, Tokyo (JP)

(72) Inventor: Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/198,495

(22) Filed: Mar. 11, 2021

(65) Prior Publication Data

US 2022/0093147 A1 Mar. 24, 2022

(30) Foreign Application Priority Data

Sep. 18, 2020 (JP) .............................. JP2020-157866

(51) Int. Cl.
*G11C 11/16* (2006.01)

(52) U.S. Cl.
CPC ................................ *G11C 11/1673* (2013.01)

(58) Field of Classification Search
CPC ................................................. G11C 11/1673
See application file for complete search history.

(56) References Cited

U.S. PATENT DOCUMENTS

| 6,067,270 | A * | 5/2000 | Hwang ..................... G11C 7/18 365/207 |
|---|---|---|---|
| 8,923,041 | B2 | 12/2014 | Andre et al. |
| 9,093,148 | B2 | 7/2015 | Hatsuda |
| 9,142,293 | B2 * | 9/2015 | Hatsuda .................. G11C 11/14 |
| 9,305,627 | B2 | 4/2016 | Hatsuda |
| 9,330,732 | B2 * | 5/2016 | Hatsuda ................... G11C 5/10 |
| 9,349,449 | B2 | 5/2016 | Hatsuda |
| 9,818,467 | B2 | 11/2017 | Matsuoka et al. |
| 10,097,207 | B2 | 10/2018 | Hatsuda |
| 10,157,655 | B2 | 12/2018 | Fujino et al. |
| 10,269,403 | B2 | 4/2019 | Osada et al. |
| 10,311,931 | B2 | 6/2019 | Matsuoka et al. |
| 10,338,835 | B2 | 7/2019 | Osada et al. |
| 10,388,345 | B2 | 8/2019 | Hatsuda et al. |
| 10,410,733 | B2 | 9/2019 | Hatsuda |
| 10,431,277 | B2 | 10/2019 | Hatsuda et al. |

(Continued)

FOREIGN PATENT DOCUMENTS

| JP | 2018163728 A | 10/2018 |
|---|---|---|
| JP | 2019164872 A | 9/2019 |

OTHER PUBLICATIONS

U.S. Appl. No. 16/821,510; First Named Inventor: Kosuke Hatsuda; Title: "Memory Device", filed: Mar. 17, 2020.

(Continued)

*Primary Examiner* — Khamdan N. Alrobaie

(74) *Attorney, Agent, or Firm* — Holtz, Holtz & Volek PC

(57) ABSTRACT

A first memory cell is coupled to first and third interconnects. A second memory cell is coupled to second and fourth interconnects. A first sense amplifier has a first terminal coupled to the first interconnect and a node of a first potential and a second terminal located close to a node of a second potential and coupled to the third interconnect and has a potential difference between the first and second terminals. A second sense amplifier has a third terminal coupled to the fourth interconnect and a node of a third potential and a fourth terminal located close to a node of a fourth potential and coupled to the second interconnect and has a potential difference between the third and fourth terminals.

12 Claims, 21 Drawing Sheets

(56) References Cited

U.S. PATENT DOCUMENTS

| | | |
|---|---|---|
| 10,460,784 B2 | 10/2019 | Ikegami et al. |
| 10,535,391 B2 | 1/2020 | Osada et al. |
| 2010/0195362 A1 | 8/2010 | Norman |
| 2012/0057400 A1* | 3/2012 | Kim .................... G11C 11/1673 365/158 |
| 2012/0320665 A1* | 12/2012 | Ueda ........................ G11C 11/16 365/158 |
| 2015/0029794 A1* | 1/2015 | Romanovskyy ....... G11C 7/062 365/209 |
| 2015/0070969 A1* | 3/2015 | Hatsu ................. G11C 11/1673 365/148 |
| 2016/0011947 A1* | 1/2016 | Hatsuda .............. G06F 11/1451 714/764 |
| 2016/0064073 A1 | 3/2016 | Matsuoka et al. |
| 2017/0148978 A1 | 5/2017 | Apalkov et al. |
| 2019/0179690 A1 | 6/2019 | Giovannini et al. |
| 2020/0302989 A1 | 9/2020 | Osada et al. |

OTHER PUBLICATIONS

U.S. Appl. No. 17/201,471; First Named Inventor: Yoshiaki Osada; Title: "Memory Device", filed Mar. 15, 2021.

* cited by examiner

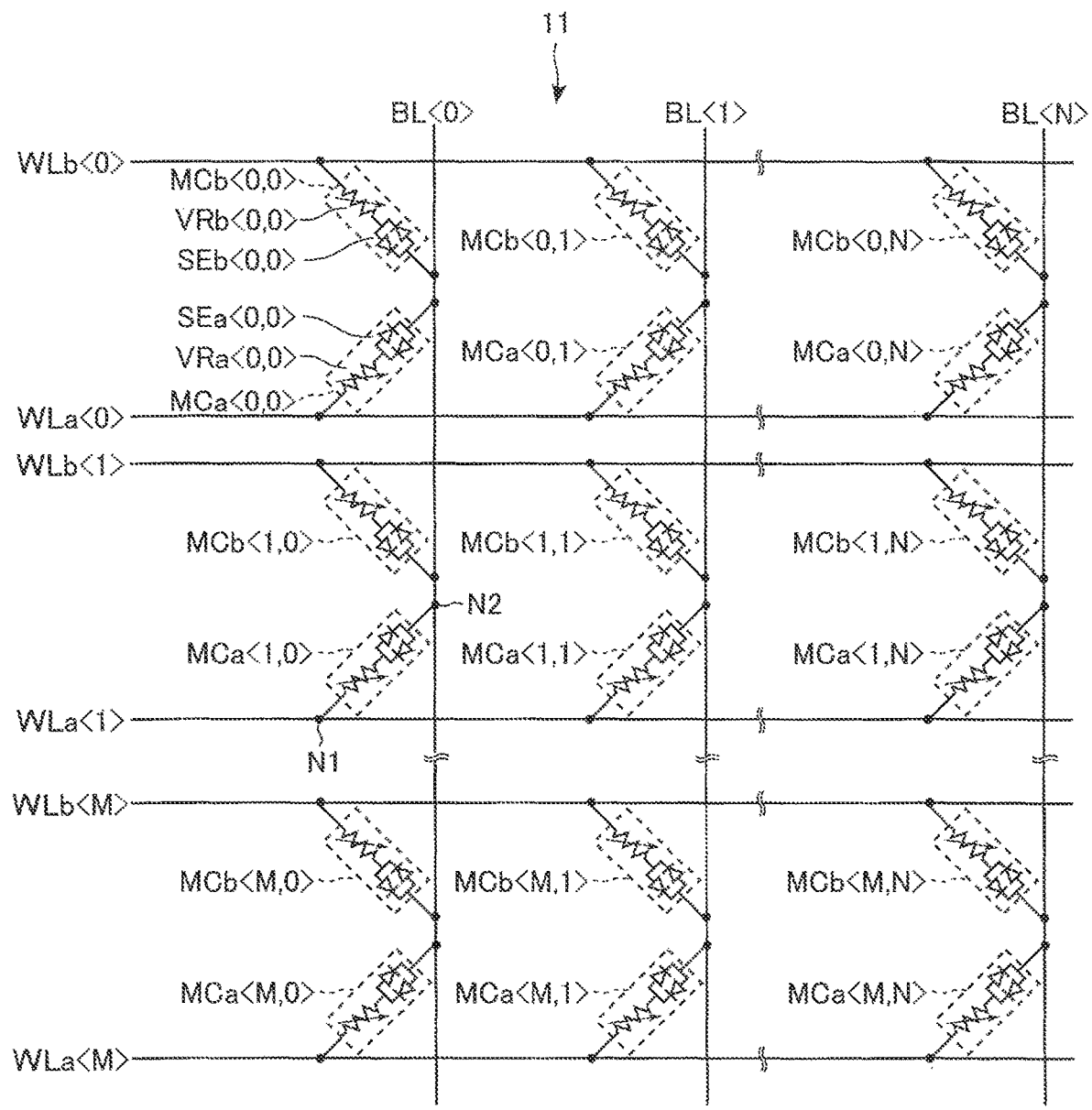
F I G. 2

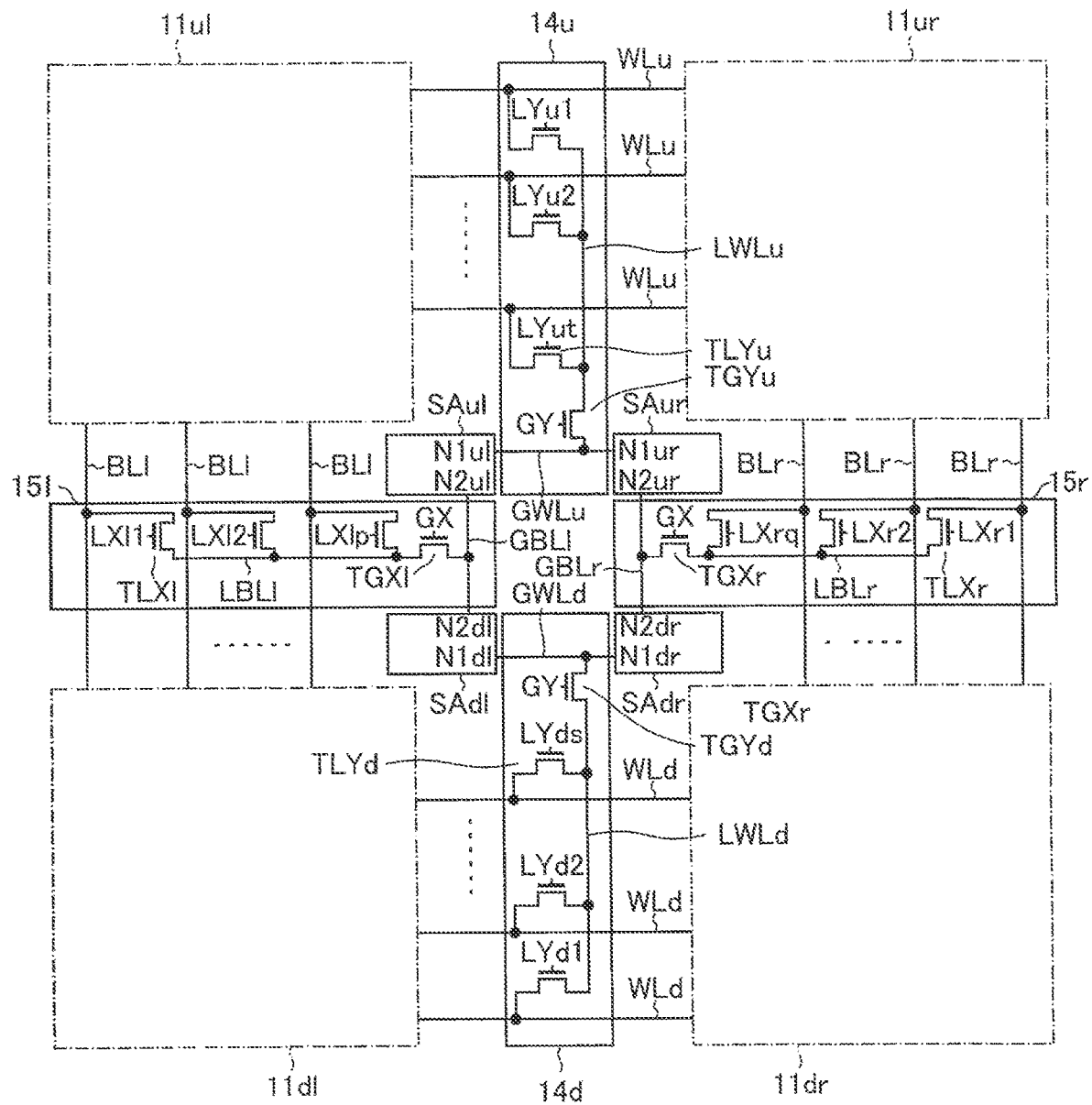
F I G. 7

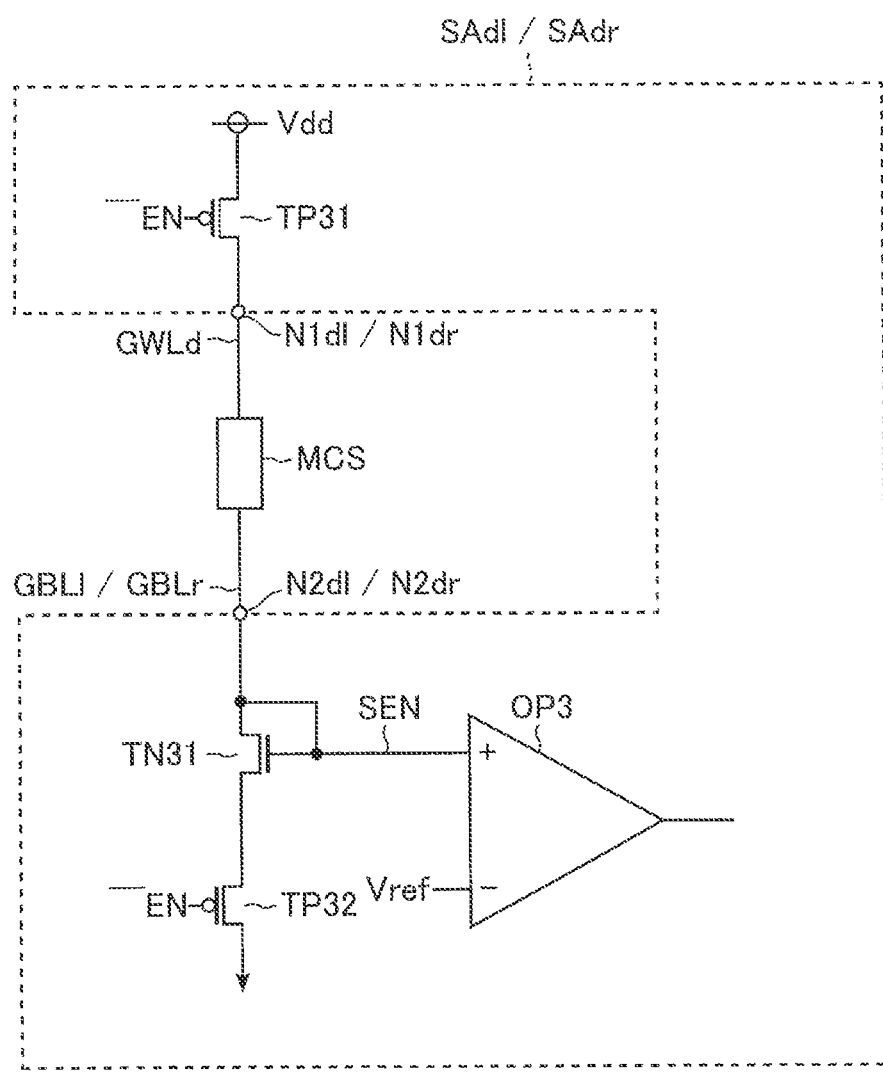
F I G. 10

VARIABLE RESISTANCE MEMORY DEVICE

CROSS-REFERENCE TO RELATED APPLICATIONS

This application is based upon and claims the benefit of priority from Japanese Patent Application No. 2020-157866, filed Sep. 18, 2020, the entire contents of which are incorporated herein by reference.

FIELD

Embodiments described herein relate generally to a variable resistance memory device.

BACKGROUND

There is known a memory device including a memory cell that can have a resistance of a different magnitude based on a state.

BRIEF DESCRIPTION OF THE DRAWINGS

FIG. 2 is a circuit diagram of a memory cell array according to the first embodiment;
FIG. 7 shows an example of components and connections of a row selector and a column selector according to the first embodiment;
FIG. 10 shows a second example of components and connections of a sense amplifier according to the first embodiment.

DETAILED DESCRIPTION

Figure 1:
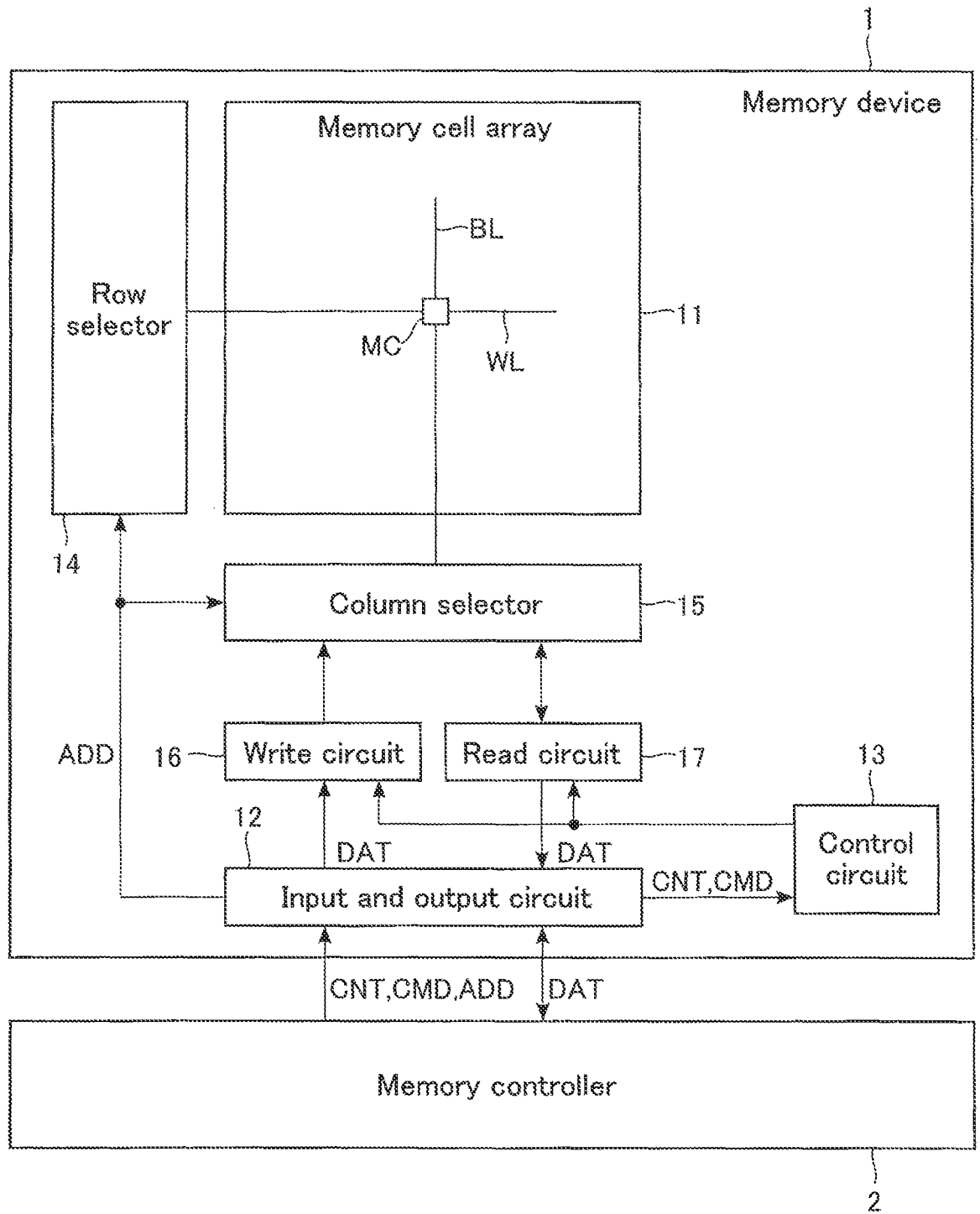
FIG. 1 shows functional blocks of a memory device according to a first embodiment.

In general, according to one embodiment, a variable resistance memory device includes: a first interconnect; a second interconnect; a third interconnect; a fourth interconnect; a first memory cell; a second memory cell; a first sense amplifier; and a second sense amplifier. The first memory cell is coupled to the first interconnect and the third interconnect, and has a variable resistance. The second memory cell is coupled to the second interconnect and the fourth interconnect, and has a variable resistance. The first sense amplifier has a first terminal and a second terminal and has a potential difference between the first terminal and the second terminal. The first terminal is coupled to the first interconnect and a node of a first potential. The second terminal is located close to a node of a second potential and coupled to the third interconnect. The second sense amplifier has a third terminal and a fourth terminal and has a potential difference between the third terminal and the fourth terminal The third terminal is coupled to the fourth interconnect and a node of a third potential. The fourth terminal is located close to a node of a fourth potential and coupled to the second interconnect.

Embodiments will now be described with reference to the figures. In the following description, components with substantially the same functionalities and configurations will be referred to with the same reference numerals, and repeated descriptions may be omitted. In order to distinguish components having substantially the same function and configuration from each other, an additional numeral or letter may be added to the end of each reference numerals. The entire description for a particular embodiment also applies to another embodiment unless explicitly mentioned otherwise or obviously eliminated.

In the specification and the claims, a phrase of a particular first component being "coupled" to another second component includes the first component being coupled to the second component either directly or via one or more components which are always or selectively conductive.

The embodiments will be described by using an xyz orthogonal coordinate system. In the description below, the terms "below" as well as terms derived therefrom and terms related thereto refer to a position having a smaller coordinate on the z-axis, and the term "above" as well as terms derived therefrom and terms related thereto refer to a position having a larger coordinate on the z-axis.

1. First Embodiment

1.1. Structure (Configuration)
1.1.1. Overall Structure

FIG. 1 shows functional blocks of a variable resistance memory device of the first embodiment. As shown in FIG. 1, a memory device 1 includes a memory cell array 11, an input and output circuit 12, a control circuit 13, a row selector 14, a column selector 15, a write circuit 16, and a read circuit 17.

The memory cell array 11 includes memory cells MC, word lines WL, and bit lines BL. The memory cell MC can store data in a non-volatile manner. Each memory cell MC is coupled to a single word line WL and a single bit line BL.

Each word line WL is associated with a row. Each bit line BL is associated with a column. Selection of a row and selection of one or more columns specify one or more memory cells MC.

The input and output circuit 12 receives various types of a control signal CNT, various types of a command CMD, an address signal ADD, and data (write data) DAT, for example, from a memory controller 2, and transmits data (read data) DAT to, for example, the memory controller 2.

The row selector 14 receives the address signal ADD from the input and output circuit 12, and brings a single word line WL associated with the row that is specified by the received address signal ADD into a selected state.

The column selector 15 receives the address signal ADD from the input and output circuit 12 and brings bit lines BL associated with the column that is specified by the received address signal ADD into a selected state.

The control circuit 13 receives the control signal CNT and the command CMD from the input and output circuit 12. The control circuit 13 controls the write circuit 16 and the read circuit 17 based on control instructed by the control signal CNT and the command CMD. Specifically, the control circuit 13 supplies voltages used for data writing to the write circuit 16 during the data writing to the memory cell array 11 further, the control circuit 13 supplies voltages used for data reading to the read circuit 17 during the reading of data from the memory cell array 11.

The write, circuit 16 receives write data DAT from the input and output circuit 12 and supplies the voltages used for data writing to the column selector 15 based on the control by the control circuit 13 and the write data DAT.

The read circuit 17 includes sense amplifiers SA, and based on the control of the control circuit 13, uses the voltages used for data reading to determine data stored in the memory cello MC. The determined data is supplied to the input and output circuit 12 as the read data DAT.

1.1.2. Circuit Configuration of Memory Cell Array

FIG. 2 is a circuit diagram of a memory cell array 11 according to the first embodiment. As shown in FIG. 2, the memory cell array 11 includes (M+1) word lines WLa (WLa<0>, WLa<1>, ... , and WLa<M>) and (M+1) word lines WLb (WLb<0>, WLb<1>, ... , and WLb<M>), where M is a natural number. The memory cell array 11 also includes (N+1) bit lines BL (BL<0>, BL<1>, ... , and BL<N>), where N is a natural number.

Each of the memory cells MC (MCa and MCb) includes two nodes: a first node N1 coupled to a single word line WL; and a second node N2 coupled to a single bit line BL. More specifically, the memory cells MCa include memory cells MCa<$\alpha$, $\beta$> for any combination of $\alpha$ and $\beta$, where $\alpha$ is an integer equal to or greater than 0 and equal to or less than M, and $\beta$ is an integer equal to or greater than 0 and equal to or less than N, and the memory cell MCa<$\alpha$, $\beta$> is coupled between the word line WLa<$\alpha$> and the bit line BL<$\beta$>. Similarly, the memory cells MCb include memory cells MCb<$\alpha$, $\beta$>, for any combination of $\alpha$ and $\beta$, where $\alpha$ is an integer equal to or greater than 0 and equal to or less than M, and $\beta$ is an integer equal to or greater than 0 and equal to or less than N, and the memory cell MCb<$\alpha$, $\beta$> is coupled between the word line WLb<$\alpha$> and the bit line BL<$\beta$>.

Each memory cell MC includes a variable resistance element VR (VRa or VRb) and a switching element SE (SEa or SEb). More specifically, the memory cell MCa<$\alpha$, $\beta$> includes a variable resistance element VRa<$\alpha$, $\beta$> and a switching element SEa<$\alpha$, $\beta$> for any combination of $\alpha$ and $\beta$, where $\alpha$ is an integer equal to or greater than 0 and equal to or smaller than M, and $\beta$ is an integer equal to or greater than 0 and equal to or smaller than N. Moreover, the memory cell MCb<$\alpha$, $\beta$> includes a variable resistance element VRb<$\alpha$, $\beta$> and a switching element SEb<$\alpha$, $\beta$> for any combination of $\alpha$ and $\beta$, where $\alpha$ is an integer equal to or greater than 0 and equal to or smaller than M, and $\beta$ is an integer equal to or greater than 0 and equal to or smaller than N.

In each memory cell MC, the variable resistance element VR and the switching element SE are coupled in series. The variable resistance element VR is coupled to a single word line WL, and the switching element SE is coupled to a single bit line BL.

The variable resistance element VR can switch between a low-resistance state and a high-resistance state. The variable resistance element VR can store 1-bit data, using the difference in the two resistance states.

The switching element SE can be a switching element described below, for example. The switching element includes two terminals, and, when a voltage smaller than a first threshold is applied in a first direction between the two terminals, the switching element is in a high-resistance state, i.e., electrically non-conductive (in an off state). On the other hand, when a voltage equal to or greater than a first threshold is applied in the first direction between the two terminals, the switching element is in a low-resistance state, i.e., electrically conductive (in an on state). The switching element is further equipped with a function similar to the function of switching between the high-resistance state and the low-resistance state based on the magnitude of the voltage applied in the first direction, with respect to a second direction opposite to the first direction. By turning the switching element on or off, control can be performed as to whether or not to supply a current to variable resistance element VR coupled to the switching element, namely, whether or not to select variable resistance element VR.

1.1.3. Structure of Memory Cell Array

Figure 3:
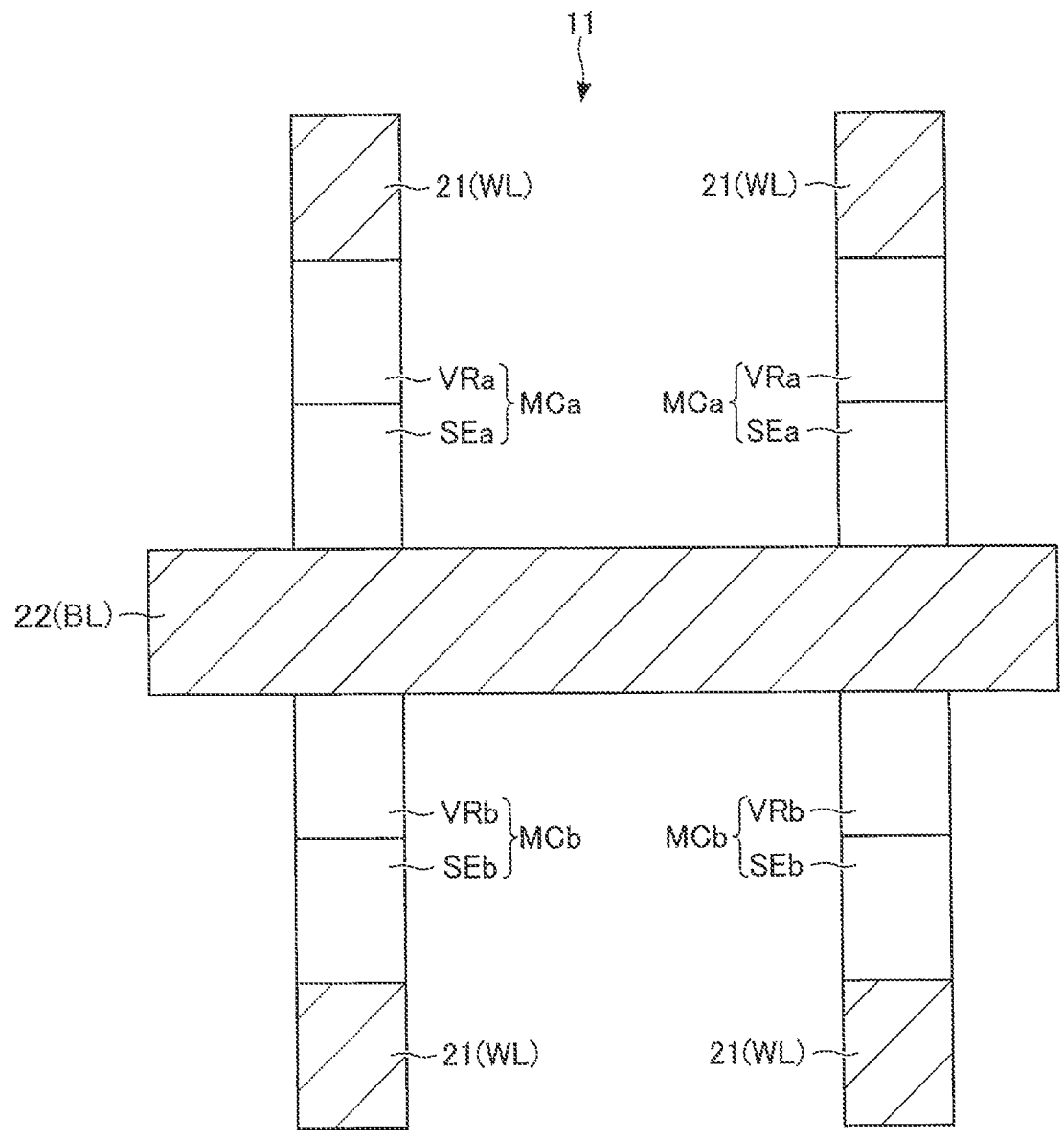
FIG. 3 shows a cross-sectional structure of part of the memory cell array according to the first embodiment.
Figure 4:
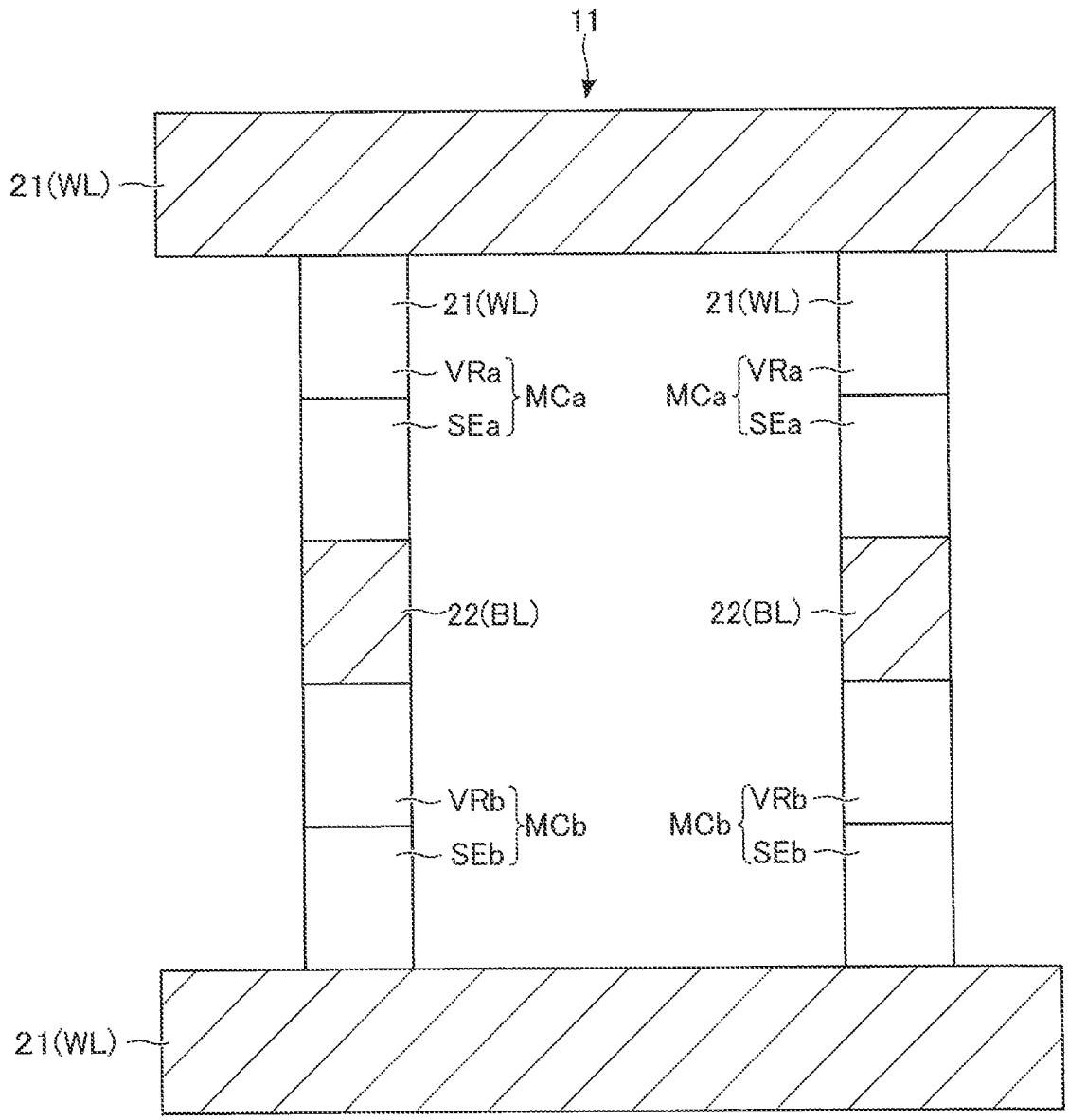
FIG. 4 shows a cross-sectional structure of part of the memory cell array according to the first embodiment.

FIGS. 3 and 4 show a cross-sectional structure of part of the memory cell array 11 of the first embodiment. FIG. 3 shows the cross-section along the xz-plane, and FIG. 4 shows the cross-section along the yz-plane. FIGS. 3 and 4 show an example where the variable resistance element VR is a magnetoresistance effect element. The following description is based on this example.

As shown in FIGS. 3 and 4, a plurality of conductors 21 are provided above the semiconductor substrate (not shown). The conductors 21 extend along the y-axis, and are aligned along the x-axis. Each conductor 21 functions as a word line WL.

Each conductor 21 is coupled, at its top surface, to the bottom surfaces of a plurality of memory cells MCb. Each memory cell MCb has, for example, a circular shape in the xy-plane. The memory cells MCb are aligned along the y-axis on each conductor 21, and this arrangement provides a matrix of memory cells MCb over the xy-plane. Each memory cell MCb includes a structure that functions as a switching element SEb and a structure that functions as a magnetoresistance effect element VRb. The structure that functions as a switching element SEb and the structure that functions as a magnetoresistance effect element VRb each have one or more layers, as will be described later.

A plurality of conductors 22 are provided above the memory cells MCb. The conductors 22 extend along the x-axis, and are aligned along the y-axis. Each conductor 22 is coupled, at its bottom surface, to the top surfaces of a plurality of memory cells MCb aligned along the x-axis. Each conductor 22 functions as a bit line BL.

Each conductor 22 is coupled, at its top surface, to the bottom surfaces of a plurality of memory cells MCa. Each memory cell MCa has, for example, a circular shape in the xy-plane. The memory cells MCa are aligned along the x-axis on each conductor 22, and this arrangement provides a matrix of memory cells MCa over the xy-plane. Each memory cell MCa includes a structure that functions as a switching element SEa and a structure that functions as a magnetoresistance effect element VRa. The structure that functions as a switching element SEa and the structure that functions as a magnetoresistance effect element VRa each have one or more layers, as will be described later.

A further conductor 21 is provided on the top surfaces of the memory cells MCa aligned along the y-axis.

The structure from the layer of the lowermost conductor 21 to the layer of the memory cell MCa shown in FIGS. 3 and 4 is repeatedly provided along the z-axis, thereby making it possible to implement the memory cell array 11 shown in FIG. 2.

The memory cell array 11 further includes an interlayer insulator in a region where none of the conductors 21 and 22 and the memory cell MC are provided.

Figure 5:
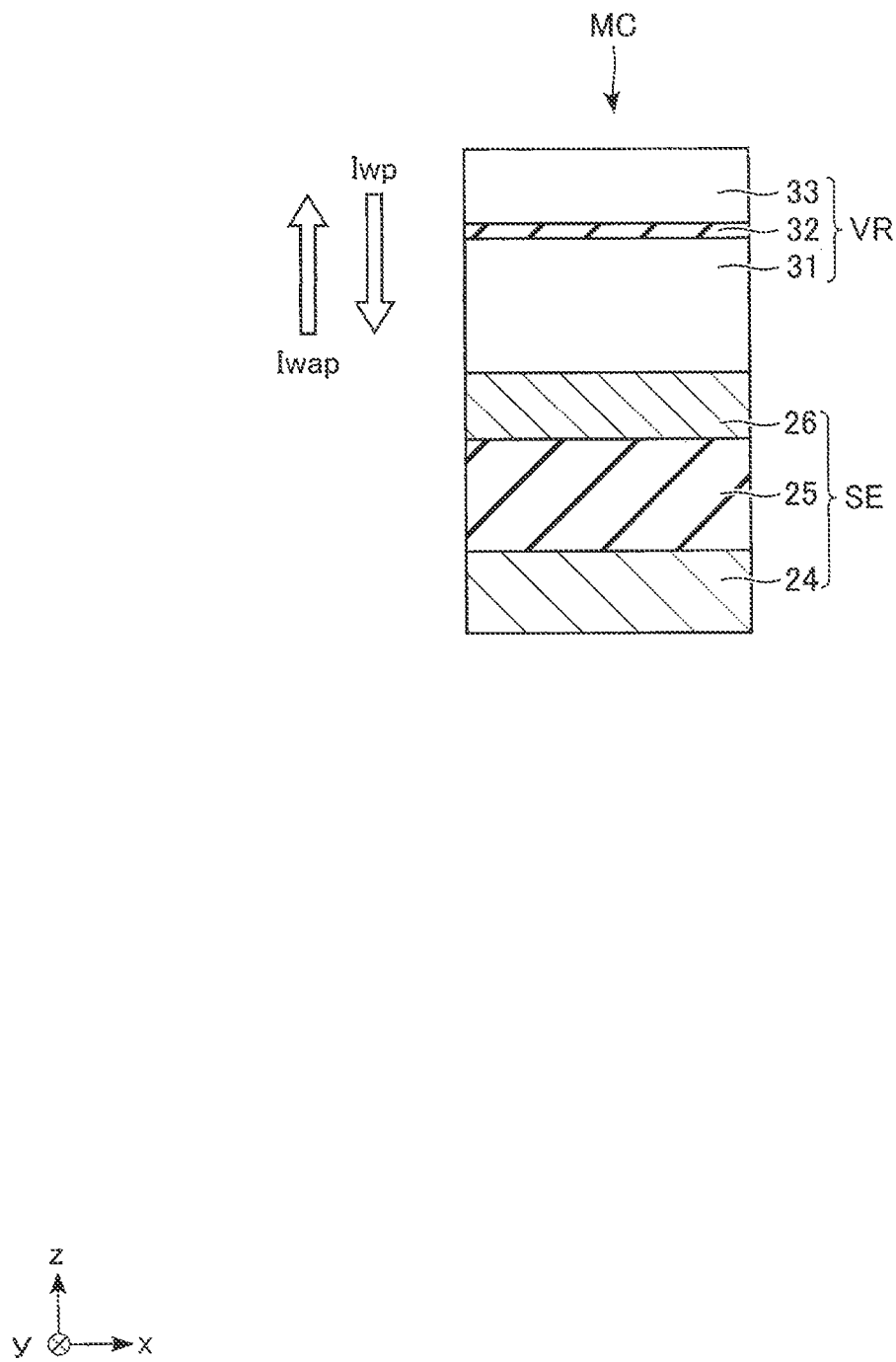
FIG. 5 shows a cross section of an example of the structure of a memory cell according to the first embodiment.

FIG. 5 shows a cross section of an example of the structure of the memory cell MC according to the first embodiment. As shown in FIG. 5, the switching element SS includes a lower electrode 24, a variable resistance material (layer) 25, and an upper electrode 26. The lower electrode 24 is located on a top surface of the conductor 21 or 22 (not shown). The variable resistance material 25 is located on a top surface of the lower electrode 24. The upper electrode 26 is located on a top surface of the variable resistance, material 25.

Each of the lower electrode 24 and the upper electrode 26 contains or is made of, for example, titanium nitride (TiN).

The variable resistance material 25 is, for example, a switching element between two terminals. The first terminal of the two terminals is one of the top and bottom surfaces of the variable resistance material 25 and the second terminal of the two terminals is the other of the top and bottom surfaces of the variable resistance material 25.

A single magnetoresistance effect element VR is located on the top surface of each upper electrode 26. The magnetoresistance effect element VR exhibits tunnel magnetoresistance, and includes a magnetic tunnel junction (MTJ). In the embodiments, the description is made with an MTJ element used as a memory element. Note that for descriptive convenience, the MTJ element will be referred to as the magnetoresistance effect, element VR hereinafter. More specifically, the magnetoresistance effect element VR includes a ferromagnetic layer 31, an insulating layer 32, and a ferromagnetic layer 33. As an example, as shown in FIG. 5, the insulating layer 32 is located on a top surface, of the ferromagnetic layer 31, and the ferromagnetic layer 33 is located on a top surface of the insulating layer 32.

The ferromagnetic layer 31 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The direction of magnetization of the ferromagnetic layer 31 is intended to remain unchanged even when data is read or written in the memory device 1. The ferromagnetic layer 31 can function as a so-called reference layer. The ferromagnetic layer 31 may include a stacked ferromagnetic layers and/or conductive layers.

The insulating layer 32 contains or is made of, for example, magnesium oxide (MgO), and functions as a so-called "tunnel barrier".

The ferromagnetic layer 33 contains or is made of cobalt iron boron (CoFeB) or boride iron (FeB), for example. The ferromagnetic layer 33 has an easy magnetization axis in a direction penetrating the interfaces between the ferromagnetic layer 31, the insulating layer 32, and the ferromagnetic layer 33, for example at an angle from 45° to 90° with respect to the interfaces, or in a direction orthogonal to the interfaces. The magnetization direction of ferromagnetic layer 33 can be changed by data writing, and the ferromagnetic layer 33 can function as a so-called "storage layer".

When the magnetization direction of ferromagnetic layer 33 is parallel to the magnetization direction of ferromagnetic layer 31, magnetoresistance effect element VR is in a state of having a lower resistance. When the magnetization direction of ferromagnetic layer 33 is anti-parallel to the magnetization direction of ferromagnetic layer 31, the magnetoresistance effect element VR is in a state of having a resistance higher than the resistance in the case where the magnetization directions of the ferromagnetic layers 31 and 33 are anti-parallel to each other.

When write current Iwp of a certain magnitude flows from the ferromagnetic layer 33 to the ferromagnetic layer 31, the magnetization direction of ferromagnetic layer 33 becomes parallel to the magnetization direction of ferromagnetic layer 31. In contrast, when write current Iwap of another magnitude flows from the ferromagnetic layer 31 to the ferromagnetic layer 33, the magnetization direction of ferromagnetic layer 33 becomes anti-parallel to the magnetization direction of ferromagnetic layer 31. With a read current Ir supplied to the magnetoresistance effect element VR, the resistance state of the magnetoresistance effect element VR can be determined based on the voltage across the magnetoresistance effect element VR with the read current supplied.

The memory cell MC may further include a conductor, an insulator, and/or a ferromagnet.

Figure 6:
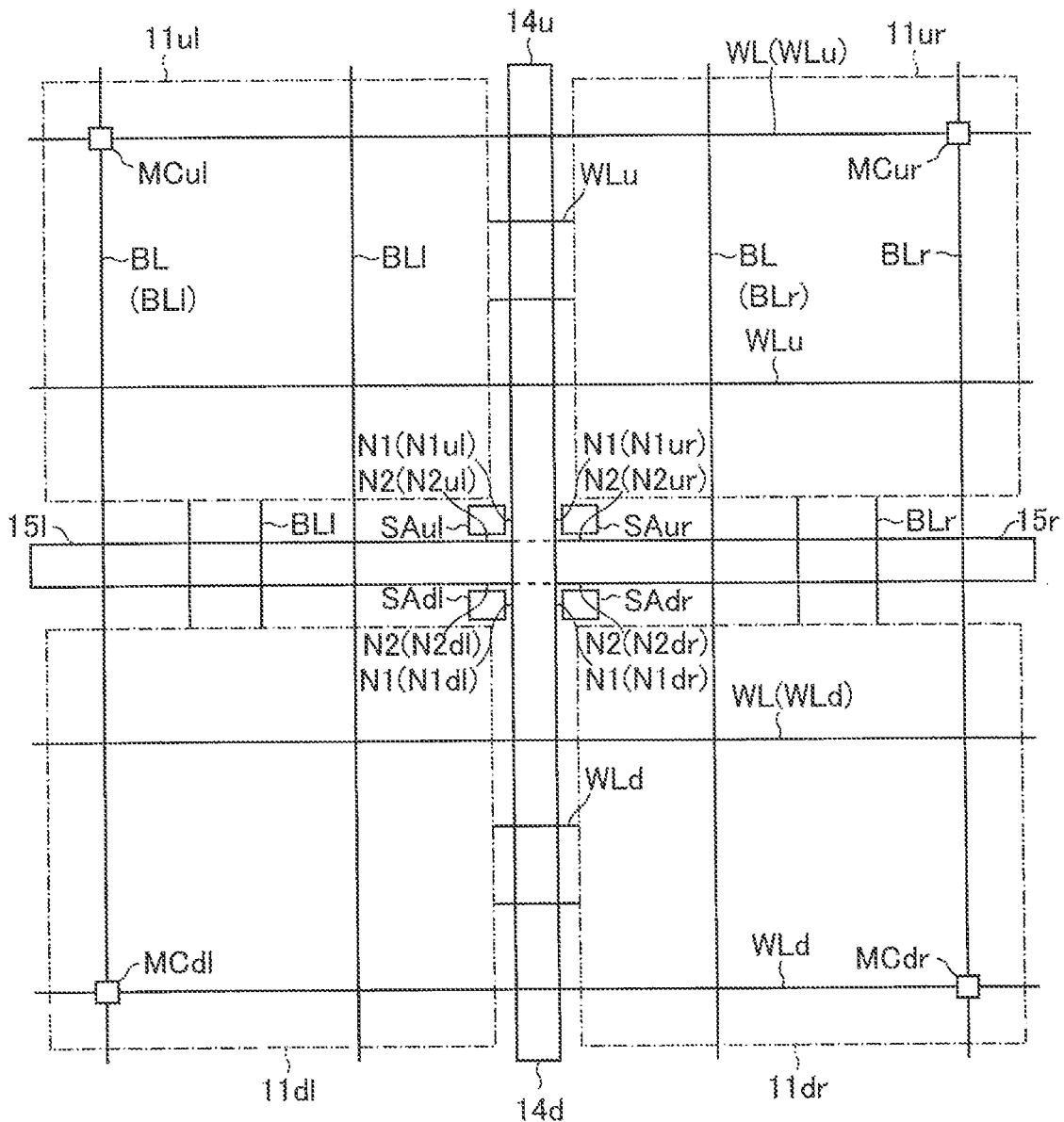
FIG. 6 shows details of some functional blocks of the memory device according to the first embodiment.

FIG. 6 shows details of some functional blocks of the memory device 1 according to the first embodiment. More specifically, FIG. 6 shows components, connections, and layout, of part of each of the memory cell array 11, the row selector 14, the column selector 15, and the write circuit 16.

As shown in FIG. 6, the memory cell array 11 is divided into four portions. The four portions each have a rectangular shape in the xy-plane, do not overlap each other, and will be referred to as sub-arrays 11$ul$, 11$ur$, 11$dl$, and 11$dr$ hereinafter. The sub-arrays 11$ul$, 11$ur$, 11$dl$, and 11$dr$ have equal or different areas, that is, includes the same or different numbers of memory ceils MC. The sub-arrays 11$ul$, 11$ur$, 11$dl$, and 11$dr$ are separated from each other. The sub-arrays 11$ul$, 11$ur$, 11$dl$, and 11$dr$ each includes word lines WL, bit lines BL, and memory cells MC. The sub-arrays 11$ul$, 11$ur$, 11$dl$, and 11$dr$ occupy the upper left, upper right, lower left, and lower right portions of the memory cell array 11 in the xy-plane, respectively. The sub-arrays 11$ul$, 11$ur$, 11$dl$, and 11$dr$ may be referred to as the upper left sub-array 11$ul$, the upper right sub-array 11$ur$, the lower left sub-array 11$dl$, and the lower right sub-array 11$dr$, respectively, hereinafter.

The word lines WL in the upper left sub-array 11$ul$ and those in the upper right sub-array 11$ur$ are common. In other words, each word line WL in the upper left sub-array 11$ul$ extends over the upper left sub-array 11$ul$ and the upper right sub-array 11$ur$. A word line WL extending over the upper left sub-array 11$ul$ and the upper right sub-array 11$ur$ may be referred to as an upper word line WLu hereinafter.

The word lines WL in the lower left sub-array 11*dl* and those in the lower right sub-array 11*dr* are common. In other words, each word line WL in the lower left sub-array 11*dl* extends over the lower left sub-array 11*dl* and the lower right sub-array 11*dr*. A word line WL extending over the lower left sub-array 11*dl* and the lower right sub-array 11*dr* may be referred to as a lower word line WLd hereinafter.

The bit lines BL in the upper left sub-array 11*ul* and those in the lower left sub-array 11*dl* are common. In other words, each bit line BL in the upper left sub-array 11*ul* extends over the upper left sub-array 11*ul* and the lower left sub-array 11*dl*. A bit line BL extending over the upper left sub-array 11*ul* and the lower left sub-array 11*dl* may be referred to as a left bit line BLl hereinafter.

The bit lines BL in the upper right sub-array 11*ur* and those in the lower right sub-array 11*dr* are common. In other words, each bit line BL in the upper right sub-array 11*ur* extends over the upper right sub-array 11*ur* and the lower right sub-array 11*dr*. A bit line BL extending over the upper right sub-array 11*ur* and the lower right sub-array 11*dr* may foe referred to as a right bit line BLr hereinafter.

Each memory cell MC is located between a single word line WL and a single bit line BL, as described with reference to FIGS. 3 and 4. A memory cell MC located between the upper word line WLu and the left bit line BLl, that is, a memory cell MC in the upper left sub-array 11*ul* may be referred to as an upper left memory cell MCul hereinafter.

A memory cell MC located between the upper word line WLu and the right bit line BLr, that is, a memory cell MC in the upper right sub-array 11*ur* may be referred to as an upper right memory cell MCur hereinafter.

A memory cell MC located between the lower word line WLd and the left bit line BLl, that is, a memory cell MC in the lower left sub-array 11*dl* may be referred to as a lower left memory cell MCdl hereinafter.

A memory cell MC located between the lower word line WLd and the right bit line BLr, that is, a memory cell MC in the lower right sub-array 11*dr* may be referred to as a lower right memory cell MCdr hereinafter.

The row selector 14 extends along the y-axis, and is located in a region between the upper left sub-array 11*ul* and the upper right sub-array 11*ur* and a region between the lower left sub-array 11*dl* and the lower right sub-array 11*dr*. The row selector 14 extends from the upper end of each of the upper left sub-array 11*ul* and the upper right sub-array 11*ur* to the lower end of each of the lower left sub-array 11*dl* and the lower right sub-array 11*dr*.

The row selector 14 is formed from a first portion 14*u* and a second portion 14*d*. The first portion 14*u* is formed from a portion of the region between the upper left sub-array 11*ul* and the upper right sub-array 11*ur* in the row selector 14. The second portion 14*d* is formed from a portion of the region between the lower left sub-array 11*dl* and the lower right sub-array 11*dr* in the row selector 14. The first portion 14*u* may be referred to as the upper row selector 14*u* hereinafter and the second portion 14*d* may be referred to as the lower row selector 14*d* hereinafter.

The upper row selector 14*u* is coupled to all the upper word lines WLu. The upper row selector 14*u* receives the address signal ADD, and couples one of the upper word lines WLu designated by the address signal ADD to a first node N1 of a sense amplifier SAul (to be described later). Furthermore, the upper row selector 14*u* couples one of the upper word lines WLu designated by the address signal ADD to a first node N1 of a sense amplifier SAur (to be described later).

The lower row selector 14*d* is coupled to all the lower word lines WLd. The lower row selector 14*d* receives the address signal ADD, and couples one of the lower word lines WLd designated by the address signal ADD to a first, node N1 of a sense amplifier SAdl (to be described later). Furthermore, the lower row selector 14*d* couples one of the lower word lines WLd designated by the address signal ADD to a first node N1 of a sense amplifier SAdr (to be described later).

The column selector 15 extends along the x-axis, and is located in a region between the upper left sub-array 11*ul* and the lower left sub-array 11*dl* and a region between the upper right sub-array 11*ur* and the lower right sub-array 11*dr*. The column selector 15 extends from the left end of each of the upper left sub-array 11*ul* and the lower left sub-array 11*dl* to the right end of each of the upper right sub-array 11*ur* and the lower right sub-array 11*dr*.

The column selector 15 is formed from a first, portion 15*l* and a second portion 15*r*. The first portion 15*l* is formed from a portion of the region between the upper left sub-array 11*ul* and the lower left sub-array 11*dl* in the column selector 15. The second portion 15*r* is formed from a portion of the region between the upper right sub-array 11*ur* and the lower right sub-array 11*dr* in the column selector 15. The first portion 15*l* may be referred to as the left column selector 15*l* hereinafter and the second portion 15*r* may be referred to as the right column selector 15*r* hereinafter.

The left column selector 15*l* is coupled to all the left bit lines BLl. The left column selector 15*l* receives the address signal ADD, and couples one of the left bit lines BLl designated by the address signal ADD to a second node N2 of the sense amplifier SAul. Furthermore, the left column selector 15*l* couples one of the left bit lines BLl designated by the address signal ADD to a second node N2 of the sense amplifier SAdl.

The right column selector 15*r* is coupled to all the right bit lines BLr. The right column selector 15*r* receives the address signal ADD, and couples one of the right bit lines BLr designated by the address signal ADD to a second node N2 of the sense amplifier SAur. Furthermore, the right column selector 15*r* couples one of the right bit lines BLr designated by the address signal ADD to a second node N2 of the sense amplifier SAdr.

The sense amplifiers SA (sense amplifiers SAul, SAur, SAdl, and SAdr) are included in the read circuit 17, and implement at least some of the operations of the read circuit 17. The sense amplifiers SAul, SAur, SAdl, and SAdr may be referred to as the upper left sense amplifier SAul, the upper right, sense amplifier SAur, the lower left sense amplifier SAdl, and the lower right sense amplifier SAdr, respectively, hereinafter.

The first node N1 and the second node N2 of the upper left sense amplifier SAul may be referred to as a first node N1*ul* and a second node N2*ul*, respectively, hereinafter. The first node N1 and the second node N2 of the upper right sense amplifier SAur may be referred to as a first node N1*ur* and a second node N2*ur*, respectively, hereinafter. The first node N1 and the second node N2 of the lower left sense amplifier SAdl may be referred to as a first node N1*dl* and a second node N2*dl*, respectively, hereinafter. The first node N1 and the second node N2 of the lower right sense amplifier SAdr may be referred to as a first node N1*dr* and a second node N2*dr*, respectively, hereinafter.

The first node N1*ul* of the upper left sense amplifier SAul is coupled to the upper row selector 14*u*. The first node N1*ul* of the upper left sense amplifier SAul can be coupled to one of the upper word lines WLu by the upper row selector 14u, as described above.

The second node N2ul of the upper left sense amplifier SAul is coupled to the left column selector 15l. The second node N2ul of the upper left sense amplifier SAul can be coupled to one of the left bit lines BLl by the left column selector 15l, as described above.

The upper left sense amplifier SAul is coupled, at the second node N2ul, to a node of a high potential (for example, power supply potential) in the upper left sense amplifier SAul, and is coupled, at the first node N1ul, a node of a low potential (for example, ground potential) in the upper left sense amplifier SAul. The potential of the second node N2ul is lower than that of the first node N1ul. The upper left sense amplifier SAul is configured to supply a current from the second node N2ul and to also draw the current at the first node N1ul. Furthermore, the upper left sense amplifier SAul can obtain data stored in a read target memory cell MC (to be referred to as a selected memory cell MCS hereinafter) coupled to the upper left sense amplifier SAul. That is, the upper left sense amplifier SAul receives a reference voltage Vref, and can compare the reference voltage Vref with the voltage of a node (to be sometimes referred to as a sense node SEN hereinafter) at which a voltage based on the resistance state of the selected memory cell MCS appears in the upper left, sense amplifier SAul. The upper left sense amplifier SAul can output, based on which one of the two compared voltages is higher, a voltage based on the state of the selected memory cell MCS by operating while the selected memory cell MCS is coupled between the first node N1ul and the second node N2ul.

The first node N1ur of the upper right sense amplifier SAur is coupled to the upper row selector 14u. The first node N1ur of the upper right sense amplifier SAur can be coupled to one of the upper word lines WLu by the upper row selector 14u, as described above.

The second node N2ur of the upper right sense amplifier SAur is coupled to the right column selector 15r. The second node N2ur of the upper right sense amplifier SAur can be coupled to one of the right bit lines BLr by the right column selector 15r, as described above.

The upper right sense amplifier SAur is coupled, at the second node N2ur, to a node of a high potential (for example, power supply potential) in the upper right sense amplifier SAur, and is coupled, at the first node N1ur, a node of a low potential (for example, ground potential) in the upper right sense amplifier SAur. The potential of the second node N2ur is lower than that of the first node N1ur. The upper right sense amplifier SAur is configured to supply a current from the second node N2ur and to draw the current at the first node N1ur. Furthermore, the upper right sense amplifier SAur can obtain data stored in the selected memory cell MCS coupled to the upper right sense amplifier SAur. That is, the upper right sense amplifier SAur receives the reference voltage Vref, and can compare the reference voltage Vref with the voltage of the sense node SEN of the upper right sense amplifier SAur. The upper right sense amplifier SAur can output, based on which one of the two compared voltages is higher, a voltage based on the state of the selected memory cell MCS by operating while the selected memory cell MCS is coupled between the first node N1ur and the second node N2ur.

The first node N1dl of the lower left sense amplifier SAdl is coupled to the lower row selector 14d. The first node N1dl of the lower left sense amplifier SAdl can be coupled to one of the lower word lines WLd by the lower row selector 14d, as described above.

The second node N2dl of the lower left sense amplifier SAdl is coupled to the left column, selector 15l. The second node N2dl of the lower left sense amplifier SAdl can be coupled to one of the left bit lines BLl by the left column selector 15l, as described above.

The lower left sense amplifier SAdl is coupled, at the first node N1dl, to a node of a high potential (for example, power supply potential) in the lower left sense amplifier SAdl, and is coupled, at the second node N2dl, a node of a low potential (for example, ground potential) in the lower left sense amplifier SAdl. The potential of the first node N1dl is lower than that of the second node N2dl. The lower left sense amplifier SAdl is configured to supply a current from the first node N1dl and to draw the current at the second node N2dl. Furthermore, the lower left sense amplifier SAdl can obtain data stored in the selected memory cell MCS coupled to the lower left sense amplifier SAdl. That is, the lower left sense amplifier SAdl receives the reference voltage Vref, and can compare the reference voltage Vref with the voltage of the sense node SEN of the lower left sense amplifier SAdl. The lower left sense amplifier SAdl can output, based on which one of the two compared voltages is higher, a voltage based on the state of the selected memory cell MCS by operating while the selected memory cell MCS is coupled between the first node N1dl and the second node N2dl.

The first node N1dr of the lower right sense amplifier SAdr is coupled to the lower row selector 14d. The first node N1dr of the lower right sense amplifier SAdr can be coupled to one of the lower word lines WLd by the lower row selector 14d, as described above.

The second node N2dr of the lower right sense amplifier SAdr is coupled to the right column selector 15r. The second node N2dr of the lower right sense amplifier SAdr can be coupled to one of the right bit lines BLr by the right column selector 15r, as described above.

The lower right sense amplifier SAdr is coupled, at the first node N1dr, to a node of a high potential (for example, power supply potential) in the lower right sense amplifier SAdr, and is coupled, at the second node N2dr, a node of a low potential (for example, ground potential) in the lower right sense amplifier SAdr. The potential of the first node N1dr is lower than that of the second node N2dr. The lower right sense amplifier SAdr is configured to supply a current, from the first node N1dr and to draw the current at the second node N2dr. Furthermore, the lower right sense amplifier SAdr can obtain data stored in the selected memory cell MCS coupled to the lower right sense amplifier SAdr. That is, the lower right sense amplifier SAdr receives the reference voltage Vref, and compare the reference voltage Vref with the voltage of the sense node SEN of the lower right sense amplifier SAdr. The lower right sense amplifier SAdr can output, based on which one of the two compared voltages is higher, a voltage based on the state of the selected memory cell MCS by operating while the selected memory cell MCS is coupled between the first node N1dr and the second node N2dr.

1.1.3.1. Details of Row Selector and Column Selector

FIG. 7 shows an example of components and connections of the row selector 14 and the column selector 15 according to the first embodiment.

As shown in FIG. 7, the upper row selector 14u includes a plurality of local row switches TLYu, a local word line LWLu, a global row switch TGYu, and a global word line GWLu. Each local row switch TLYu is coupled between a single upper word line WLu and the local word line LWLu. Each local row switch TLYu receives, at its control terminal, a control signal LYu (LYu1, LYu2, ..., or LYut (t is a natural number)) unique to the local row switch TLYu from another component (not shown) in the row selector 14, and is turned on or off based on the control signal LYu. Each local row switch TLYu can be an n-type metal-oxide-semiconductor field-effect transistor (MOSFET), and receives the control signal LYu at its gate terminal. The upper row selector 14u sets, to a level (for example, high level) for designating selection, only the control signal LYu supplied to one of the plurality of local row switches TLYu designated by the address signal ADD. As a result, among the plurality of local row switches TLYu, only the local row switch TLYu that is receiving the control signal LYu of the level for designating selection remains on.

When one of the plurality of local row switches TLYu is turned on, the upper word line WLu coupled to the local row switch TLYu is coupled to the local word line LWLu via the local row switch TLYu.

The local word line LWLu is coupled to the global word line GWLu via the global row switch TGYu. The global row switch TGYu receives, at its control terminal, a control signal GY from another component (not shown) in the row selector 14, and is turned on or off based on the control signal GY. The global row switch TGYu can be an n-type MOSFET, and receives the control signal GY at its gate terminal.

The lower row selector 14d includes a plurality of local row switches TLYd, a local word line LWLd, a global row switch TGYd, and a global word line GWLd. Each local row switch TLYd is coupled between a single lower word line WLd and the local word line LWLd. Each local row switch TLYd receives, at its control terminal, a control signal LYd (LYd1, LYd2, ..., or LYds (s is a natural number)) unique to the local row switch TLYd from another component (not shown) in the row selector 14, and is turned on or off based on the control signal LYd. Each local row switch TLYd can be an n-type MOSFET, and receives the control signal LYd at its gate terminal. The lower row selector 14d sets, to a level (for example, high level) for designating selection, only the control signal LYd supplied to one of the plurality of local row switches TLYd designated by the address signal ADD. As a result, among the plurality of local row switches TLYd, only the local row switch TLYd that is receiving the control signal LYd of the level for designating selection remains on.

When one of the plurality of local row switches TLYd is turned on, the lower word line WLd coupled to the local row switch TLYd is coupled to the local word line LWLd via the local row switch TLYd.

The local word line LWLd is coupled to the global word line GWLd via the global row switch TGYd. The global row switch TGYd receives, at its control terminal, the control signal GY from another component (not shown) in the row selector 14, and is turned on or off based on the control signal GY. The global row switch TGYd can be an n-type MOSFET, and receives the control signal GY at its gate terminal.

The left column selector 15l includes a plurality of local column switches TLXl, a local bit line LBLl, a global column switch TGXl, and a global bit line GBLl. Each local column switch TLXl is coupled between a single left bit line BLl and the local bit line LBLl. Each local column switch TLXl receives, at its control terminal, a control signal LXl (LXl1, LXl2, ..., or LXlp (p is a natural number)) unique to the local column switch TLXl from another component (not shown) in the column selector 15, and is turned on or off based on the control signal LXl. Each local column switch TLXl can be an n-type MOSFET, and receives the control signal LYl at its gate terminal. The left column selector 15l sets, to a level (for example, high level) for designating selection, only the control signal LYl supplied to one of the plurality of local column switches TLXl designated by the address signal ADD. As a result, among the plurality of local column switches TLXl, only the local column switch TLXl that is receiving the control signal LYl of the level for designating selection remains on.

When one of the plurality of local column switches TLXl is turned on, the left bit line BLl coupled to the local column switch TLXl is coupled to the local bit line LBLl via the local column switch TLXl.

The local bit line LBLl is coupled to the global bit line GBLl via the global column switch TGXl. The global column switch TGXl receives, at its control terminal, a control signal GX from another component (not shown) in the column selector 15, and is turned on or off based on the control signal GX. The global column switch TGXl can be an n-type MOSFET, and receives the control signal GX at its gate terminal.

The right column selector 15r includes a plurality of local column switches TLXr, a local bit line LBLr, a global column switch TGXr, and a global bit line GBLr. Each local column switch TLXr is coupled between a single right bit line BLr and the local bit line LBLr. Each local column switch TLXr receives, at its control terminal, a control signal LXr (LXr1, LXr2, ..., or LXrq (q is a natural number)) unique to the local column switch TLXr from another component (not shown) in the column selector 15, and is turned on or off based on the control signal LXr. Each local column switch TLXr can be an n-type MOSFET, and receives the control signal LYr at its gate terminal. The right column selector 15r sets, to a level (for example, high level) for designating selection, only the control signal LYr supplied to one of the plurality of local column switches TLXr designated by the address signal ADD. As a result, among the plurality of local column switches TLXr, only the local column switch TLXr that is receiving the control signal LYr of the level for designating selection remains on.

When one of the plurality of local column switches TLXr is turned on, the right bit line BLr coupled to the local column switch TLXr is coupled to the local bit line LBLr via the local column switch TLXr.

The local bit line LBLr is coupled to the global bit line GBLr via the global column switch TGXr. The global column switch TGXr receives, at its control terminal, the control signal GX from another component (not shown) in the column selector 15, and is turned on or off based on the control signal GX. The global column switch TGXr can be an n-type MOSFET, and receives the control signal GX at its gate terminal.

1.1.3.2. Details of Sense Amplifier

Each of the upper left sense amplifier SAul and the upper right sense amplifier SAur can include any components and connections as long as it can supply a current from its second node N2, draw the current at its first node N1, and obtain read data based on the voltage of the sense node SEN and the reference voltage Vref, as described above. Similarly, each of the lower left sense amplifier SAdl and the lower right sense amplifier SAdr can include any components and connections as long as it can supply a current from its first node N1, draw the current at its second node N2, and obtain read data based on the voltage of the sense node SEN and the reference voltage Vref.

Some detailed examples will be described below. However, details of the upper left sense amplifier SAul, the upper right sense amplifier SAur, the lower left sense amplifier SAdl, and the lower right sense amplifier SAdr do not limit the first embodiment.

1.1.3.2.1. First Example

Figure 8:
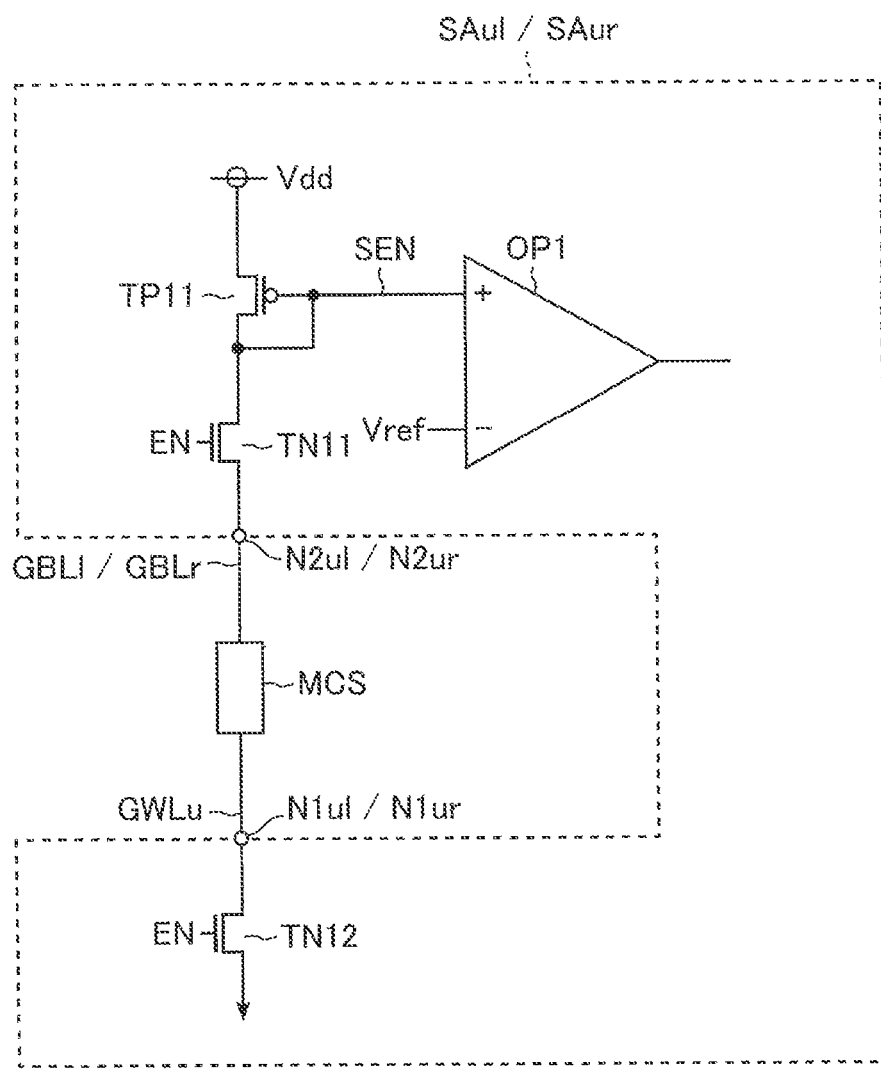
FIG. 8 shows the first example of components and connections of a sense amplifier according to the first embodiment.

FIG. 8 shows a first example of components and connections of the upper left sense amplifier SAul or the upper right sense amplifier SAur according to the first embodiment. As shown in FIG. 8, each of the upper left sense amplifier SAul and the upper right sense amplifier SAur includes a p-type MOSFET TP11, n-type MOSFETs TN11 and TN12, and an operational amplifier OP1.

The transistor TP11 is coupled to a node of a power supply potential (for example, Vdd) at its first terminal (one of the source and the drain), and is coupled, at its second terminal (the other of the source and the drain), to its gate and a first terminal of the transistor TN11. A gate of the transistor TP11 functions as the sense node SEN, and is coupled to a noninverting input terminal of the operational amplifier OP1.

The operational amplifier OP1 receives the reference voltage Vref at its inverting input terminal. An output from the operational amplifier OP1 is received by a data latch in the read circuit 17.

A second terminal of the transistor TN11 is coupled to the second node N2$ul$ in the upper left sense amplifier SAul, and is coupled to the second node N2$ur$ in the upper right sense amplifier SAur. A gate of the transistor TN11 receives an enable signal EN. The enable signal EN is supplied from, for example, the control circuit 13.

A first terminal of the transistor TN12 is coupled to the first node N1$ul$ in the upper left sense amplifier SAul, and is coupled to the first, node N1$ur$ in the upper right sense amplifier SAur. A second terminal of the transistor TN12 is coupled to a node of a common potential (for example, a ground potential Vss). A gate of the transistor TN12 receives the enable signal EN.

Figure 9:
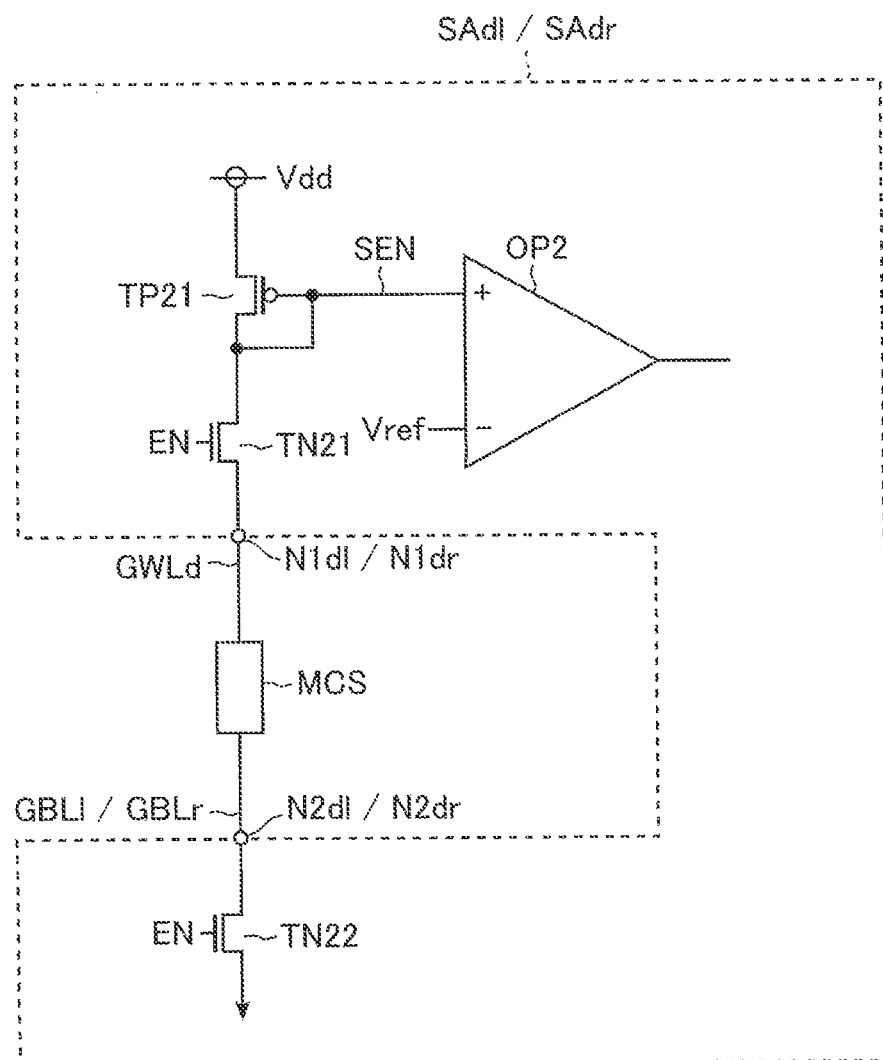
FIG. 9 shows a first example of components and connections of another sense amplifier according to the first embodiment.

FIG. 9 shows a first example of components and connections of the lower left sense amplifier SAdl or the lower right sense amplifier SAdr according to the first embodiment. As shown in FIG. 9, each of the lower left sense amplifier SAdl and the lower right sense amplifier SAdr includes a p-type MOSFET TP21, n-type MOSFETs TN21 and TN22, and an operational amplifier OP2.

The transistor TP21 is coupled to a node of the power supply potential at its first terminal, and is coupled, at its second terminal, to its gate and a first terminal of the transistor TN21. A gate of the transistor TP21 functions as the sense node SEN, and is coupled to a noninverting input terminal of the operational amplifier OP2.

The operational amplifier OP2 receives the reference voltage Vref at its inverting input terminal. An output from the operational amplifier OP2 is received by the data latch in the read circuit 17.

A second terminal of the transistor TN21 is coupled to the first node N1$dl$ in the lower left sense amplifier SAdl, and is coupled to the first node N1$dr$ in the lower right sense amplifier SAdr. A gate of the transistor TN21 receives the enable signal EN.

A first terminal of the transistor TN22 is coupled to the second node N2$dl$ in the lower left sense amplifier SAdl, and is coupled to the second node N2$dr$ in the lower right sense amplifier SAdr. A second terminal of the transistor TN22 is coupled to a node of the ground potential. A gate of the transistor TN22 receives the enable signal EN.

1.1.3.2.2. Second Example

FIG. 10 shows a second example of components and connections of the lower left sense amplifier SAdl or the lower right sense amplifier SAdr according to the first embodiment. As shown in FIG. 10, each of the lower left sense amplifier SAdl and the lower right sense amplifier SAdr includes an n-type MOSFET TN31, p-type MOSFETs TP31 and TP32, and an operational amplifier OP3.

The transistor TP31 is coupled to a node of the power supply potential at its first terminal. A second terminal of the transistor TP31 is coupled to the first node N1$dl$ in the lower left sense amplifier SAdl, and is coupled to the first node N1$dr$ in the lower right sense amplifier SAdr. A gate of the transistor TP31 receives an enable signal $^-$EN. The sign "$^-$" indicates that a signal added with "$^-$" has the logic obtained by inverting the logic of a signal of a name without "$^-$".

The transistor TN31 is coupled, at its first terminal, to the second node N2$dl$ in the lower left sense amplifier SAdl and to the second node N2$dr$ in the lower right sense amplifier SAdr. The transistor TN31 is coupled to its gate at its first terminal. The gate of the transistor TN31 functions as the sense node SEN, and is coupled to an noninverting input terminal of the operational amplifier OP3. The operational amplifier OP3 receives the reference voltage Vref at its inverting input terminal. An output from the operational amplifier OP3 is received by the data latch in the read circuit 17.

A second terminal of the transistor TN31 is coupled to a first terminal of the transistor TP32. The transistor TP32 is coupled to a node of the ground potential at its second terminal, and receives the enable signal $^-$EN at its gate.

1.2. Operation

Figure 11:
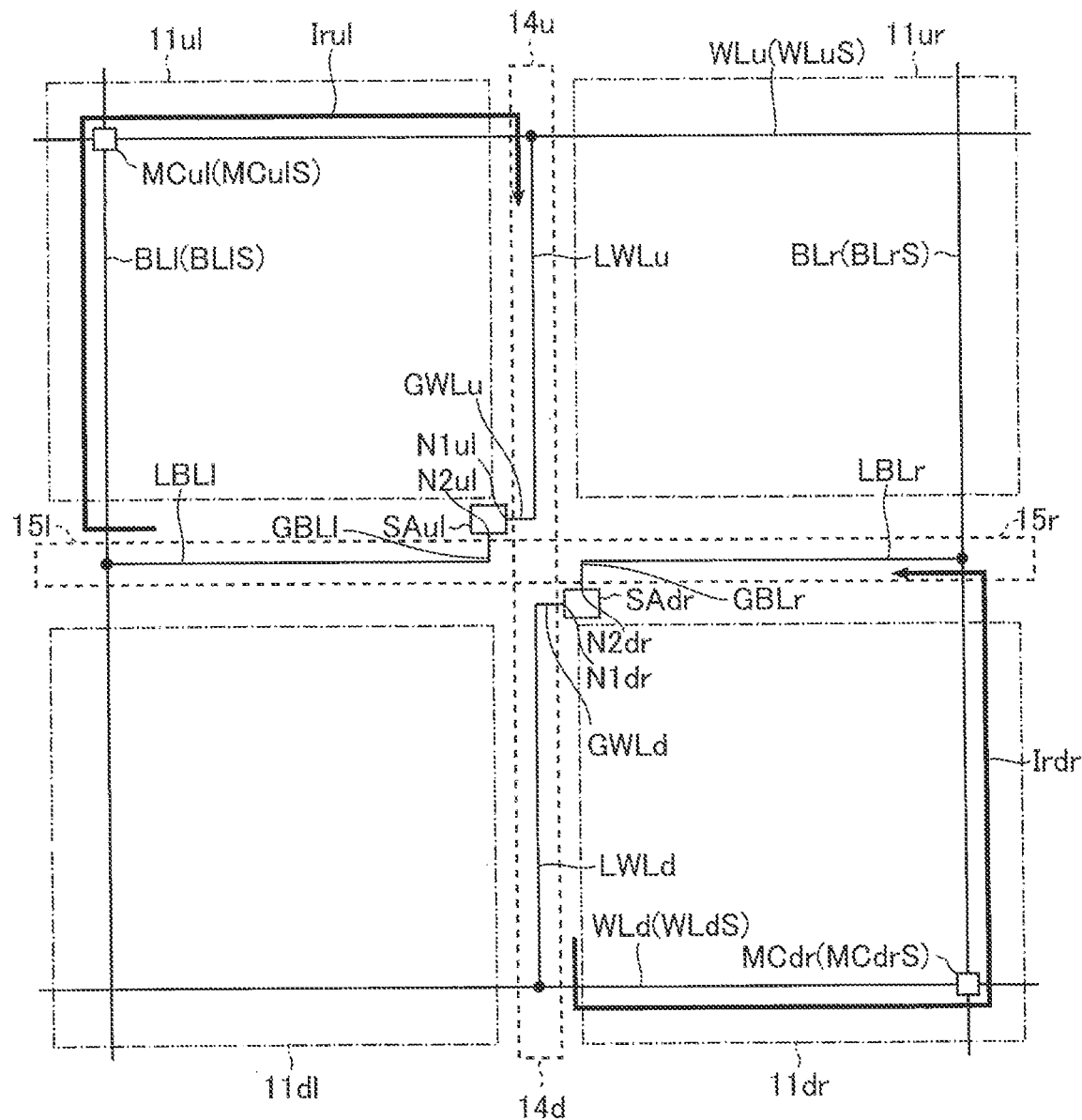
FIG. 11 shows a state during data reading from the memory device according to the first embodiment.

FIG. 11 shows a state during data reading from the memory device 1 according to the first embodiment. FIG. 11 shows the same components and range as in FIG. 6, and represents the layout, similarly to FIG. 6.

The memory device 1 reads data from a selected upper left memory cell MCulS of the upper left memory cells MCul and a selected lower right memory cell MCdrS of the lower right memory cells MCdr in parallel or a selected upper right memory cell MCurS of the upper right memory cells MCur and a selected lower left memory cell MCdl of the lower left memory cells MCdl in parallel. FIG. 11 is related to an example of data reading from a selected upper left memory cell MCulS and a selected lower right memory cell MCdrS. FIG. 11 shows only components associated with data reading from the selected upper left memory cell MCulS and the selected lower right memory cell MCdrS.

When the local row switch TLYu (not shown) coupled to the upper word line WLu coupled to the selected upper left memory cell MCulS is turned on, the upper word line WLu is coupled to the local word line LWLu. Furthermore, when the global row switch TGYu (not shown) is turned on, the local word line LWLu is coupled to the first node N1$ul$ of the upper left sense amplifier SAul. A upper word line WLu coupled to the selected upper left memory cell MCulS may be referred to as a selected upper word line WLuS hereinafter.

When the local column switch TLXl (not shown) coupled to the left bit line BLl coupled to the selected upper left memory cell MCulS is turned on, the left bit line BLl is coupled to the local bit line LBLl. Furthermore, when the global column switch TGXl (not shown) is turned on, the local bit line LBLl is coupled to the second node N2$ul$ of the upper left sense amplifier SAul. A left bit line BLl coupled to the selected upper left memory cell MCulS may be referred to as a selected left bit line BLlS hereinafter.

A state in which a selected upper left memory cell MCulS is coupled to the first node N1*ul* and the second node N2*ul* of the upper left sense amplifier SAul via the local row switch TLYu and the local column switch TLXl which are coupled to the selected upper left memory cell MCulS and are ON, as described above, may be referred to as an upper-left-memory-cell selected state hereinafter.

When the local row switch TLYd (not shown) coupled to the lower word line WLd coupled to the selected lower right memory cell MCdrS is turned on, the lower word line WLd is coupled to the local word line LWLd. Furthermore, when the global row switch TGYd (not shown) is turned on, the local word line LWLd is coupled to the first node N1*dr* of the lower right sense amplifier SAdr. A lower word line WLd coupled to the selected lower right memory cell MCdrS may be referred to as a selected lower word line WLdS hereinafter.

When the local column switch TLXr (not shown) coupled to the right bit line BLr coupled to the selected lower right memory cell MCdrS is turned on, the right bit line BLr is coupled to the local bit line LBLr. Furthermore, when the global column switch TGXr (not shown) is turned on, the local bit line LBLr is coupled to the second node N2*dr* of the lower right sense amplifier SAdr. A right bit line BLr coupled to the selected lower right memory cell MCdrS may be referred to as a selected right bit line BLrS hereinafter.

A state in which a selected lower right memory cell MCdrS is coupled to the first node N1*dr* and the second node N2*dr* of the lower right sense amplifier SAdr via the local row switch TLYd and the local column switch TLXr which are coupled to the selected lower right memory cell MCdrS and are ON, as described above, may be referred to as a lower-right-memory-cell selected state hereinafter.

Among the local row switches TLYu and TLYd and the local column switches TLXl and TLXr, the switch which does not contribute to formation of either of the upper-left-memory-cell selected state and the lower-right-memory-cell selected state is maintained OFF during the upper-left-memory-cell selected state and the lower-right-memory-cell selected state.

In the state in which both the upper-left-memory-cell selected state and the lower-right-memory-cell selected state are formed as described above, the enable signals EN of the upper left sense amplifier SAul and the lower right sense amplifier SAdr are set at the high level. This enables the upper left sense amplifier SAul and the lower right sense amplifier SAdr to start data reading from the selected upper left memory cell MCulS and the selected lower right memory cell MCdrS.

Along with the start of data reading, in the upper left sub-array 11*ul*, the selected left bit line BLlS is coupled to the node of the power supply potential via the upper left sense amplifier SAul, and the selected upper word line WLuS is coupled to the node of the ground potential via the upper left sense amplifier SAul. Therefore, a read current Irul flows from the selected left bit line BLlS to the selected upper word line WLuS in the selected upper left memory cell MCulS. The read current Irul has a magnitude based on the resistance state of the selected upper left memory cell MCulS, and influences the voltage of the sense node SEN in the upper left sense amplifier SAul, that is, the voltage of the noninverting input terminal of the operational amplifier OP1. The upper left sense amplifier SAul outputs a voltage based on the voltage of the noninverting input terminal of the operational amplifier OP1. The thus output voltage reflects the resistance state of the selected upper left memory cell MCulS, and is data read from the selected upper left memory cell MCulS.

Along with the start of data reading, in the lower right sub-array 11*dr*, the selected lower word line WLdS is coupled to the node of the power supply potential via the lower right sense amplifier SAdr, and the selected right bit line BLrS is coupled to the node of the ground potential via the lower right sense amplifier SAdr. Therefore, a read current Irdr flows from the selected lower word line WLdS to the selected right bit line BLrS in the selected lower right memory cell MCdrS. The read current Irdr has a magnitude based on the resistance state of the selected lower right memory cell MCdrS, and influences the voltage of the sense node SEN in the lower right sense amplifier SAdr, that is, the voltage of the noninverting input terminal of the operational amplifier OP2. The lower right sense amplifier SAdr outputs a voltage based on the voltage of the noninverting input terminal of the operational amplifier OP2. The thus output voltage reflects the resistance state of the selected lower right memory cell MCdrS, and is data read from the selected lower right memory cell MCdr.

Data reading from the selected upper left memory cell MCulS and data reading from the selected lower right memory cell MCdrS can occur in parallel.

Figure 12:
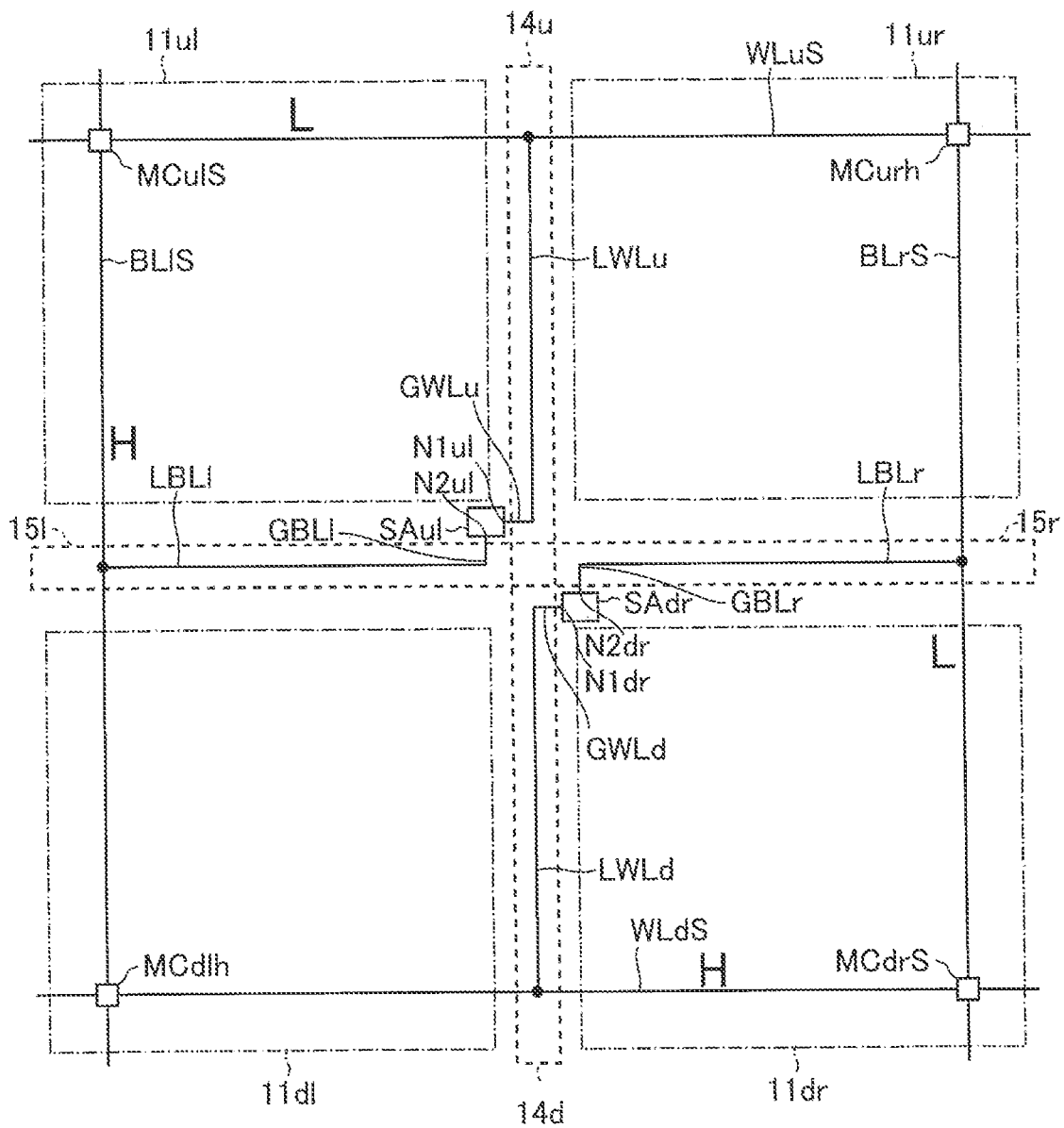
FIG. 12 shows a state of the memory device according to the first embodiment.

FIG. 12 shows a state of the memory device according to the first embodiment. Wore specifically, FIG. 12 further shows some components, which are not shown in FIG. 11, in the same upper-left-memory-cell selected state and lower-right-memory-cell selected state as in FIG. 11. In the following description, the word lines WL and bit lines BL which are coupled to the nodes of the power supply potential via the sense amplifiers SA are referred to as being at high (H) level. The word lines WL and bit lines BL which are coupled to the nodes of the ground potential via the sense amplifiers SA are referred to as being at low (L) level.

As shown in FIG. 12, a voltage of high level is applied to the selected left bit line BLlS to form the upper-left-memory-cell selected state, and a voltage of high level is applied to the selected lower word line WLdS to form the lower-right-memory-cell selected state. The selected left bit line BLlS of high level applies a voltage of high level to the second node of the lower left memory cell MCdl, which may be referred to as a non-selected lower left memory cell MCdlh hereinafter, coupled to the selected left bit line BLlS. However, the first node of the non-selected lower left memory cell MCdlh is applied with a voltage of high level by the selected lower word line WLdS of high level. That is, the same voltage is applied to both the terminals of the non-selected lower left memory cell MCdlh. Therefore, the read current does not flew at all or hardly flows in the non-selected lower left memory cell MCdlh, and data reading from the non-selected lower left memory cell MCdlh does not occur. That is, interference of the resistance state by the non-selected lower left memory cell MCdlh to data reading from the selected upper left memory cell MCulS and the selected lower right memory cell MCdrS is suppressed.

Similarly, a voltage of low level is applied to the selected upper word line WLuS to form the upper-left-memory-cell selected state, and a voltage of low level is applied to the selected right bit line BLrS to form the lower-right-memory-cell selected state. The selected upper word line WLuS of low level applies a voltage of low level to the first node of the upper right memory cell MCur, which may be referred to as a non-selected upper right memory cell MCurh hereinafter, coupled to the selected left bit line BLlS. However, the second node of the non-selected upper right memory cell MCurh is applied with a voltage of low level by the selected right bit line BLrS of low level. That is, the same voltage is applied to both the terminals of the non-selected upper right memory cell MCurh. Therefore, the read current does not flow at all or hardly flows in the non-selected upper right memory cell MCurh, and data reading from the non-selected upper right memory cell MCurh does not occur. That is, interference of the resistance state by the non-selected upper right memory cell MCurh to data reading from the selected upper left memory cell MCulS and the selected lower right memory cell MCdrS is suppressed.

Parallel data reading from a selected upper right memory cell MCurS of the upper right memory cells MCur and a selected lower left memory cell MCdlS of the lower left memory cells MCdl is similarly performed by the same principle as that of data reading from the selected upper left memory cell MCulS and the selected lower right memory cell MCdrS. An overview is as follows.

Figure 13:
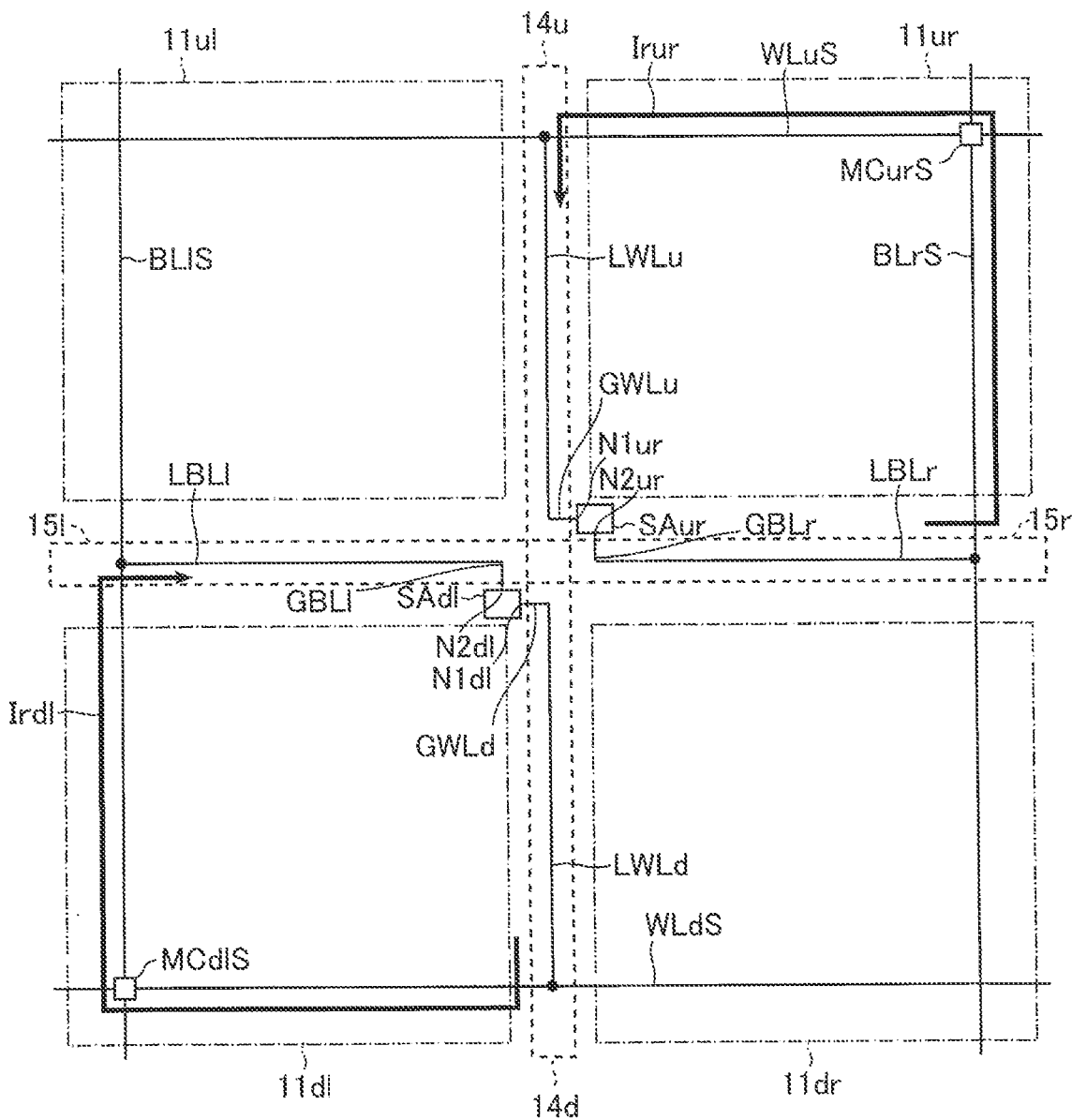
FIG. 13 shows a state during data reading from the memory device according to the first embodiment.

FIG. 13 shows a state during data reading from the memory device 1 according to the first embodiment. FIG. 13 shows the same components and range as in FIG. 6, and represents the layout, similarly to FIG. 6. FIG. 13 is related to an example of data reading from a selected upper right memory cell MCurS and a selected lower left memory cell MCdlS. FIG. 13 shows only components associated with data reading from the selected upper right memory cell MCurS and the selected lower left memory cell MCdlS.

The selected upper right memory cell MCurS is coupled to the first node N1*ur* and the second node N2*ur* of the upper right sense amplifier SAur via the local row switch TLYu (not shown) and the local column switch TLXr (not shown) which are coupled to the selected upper right memory cell MCurS and are ON. Thus, an upper-right-memory-cell selected state is formed.

Furthermore, the selected lower left memory cell MCdlS is coupled to the first node N1*dl* and the second node N2*dl* of the lower left sense amplifier SAdl via the local row switch TLYd (not shown) and the local column switch TLXl (not shown) which are coupled to the selected lower left memory cell MCdlS and are ON. Thus, a lower-left-memory-cell selected state is formed.

In a state in which both the upper-right-memory-cell selected state and the lower-left-memory-cell selected state are formed, the enable signals EN of the upper right sense amplifier SAur and the lower left sense amplifier SAdl are set at high level. This enables the upper right sense amplifier SAur and the lower left sense amplifier SAdl.

In the upper right sub-array 11*ur*, the selected right bit line BLrS is coupled to the node of the power supply potential via the upper right sense amplifier SAur, and the selected upper word line WLuS is coupled to the node of the ground potential via the upper right sense amplifier SAur. Therefore, a read current Irur flows from the selected right bit line BLrS to the selected upper word line WLuS in the selected upper right memory cell MCurS. Thus, the upper right sense amplifier SAur obtains data read from the selected upper right memory cell MCurS.

In the lower left sub-array 11*dl*, the selected lower word line WLdS is coupled to the node of the power supply potential via the lower left sense amplifier SAdl, and the selected left bit line BLlS is coupled to the node of the ground potential via the lower left sense amplifier SAdl. Therefore, a read current Irdl flows from the selected lower word line WLdS to the selected left bit line BLlS in the selected lower left memory cell MCdlS. Thus, the lower left sense amplifier SAdl obtains data read from the selected lower left memory cell MCdlS.

Figure 14:
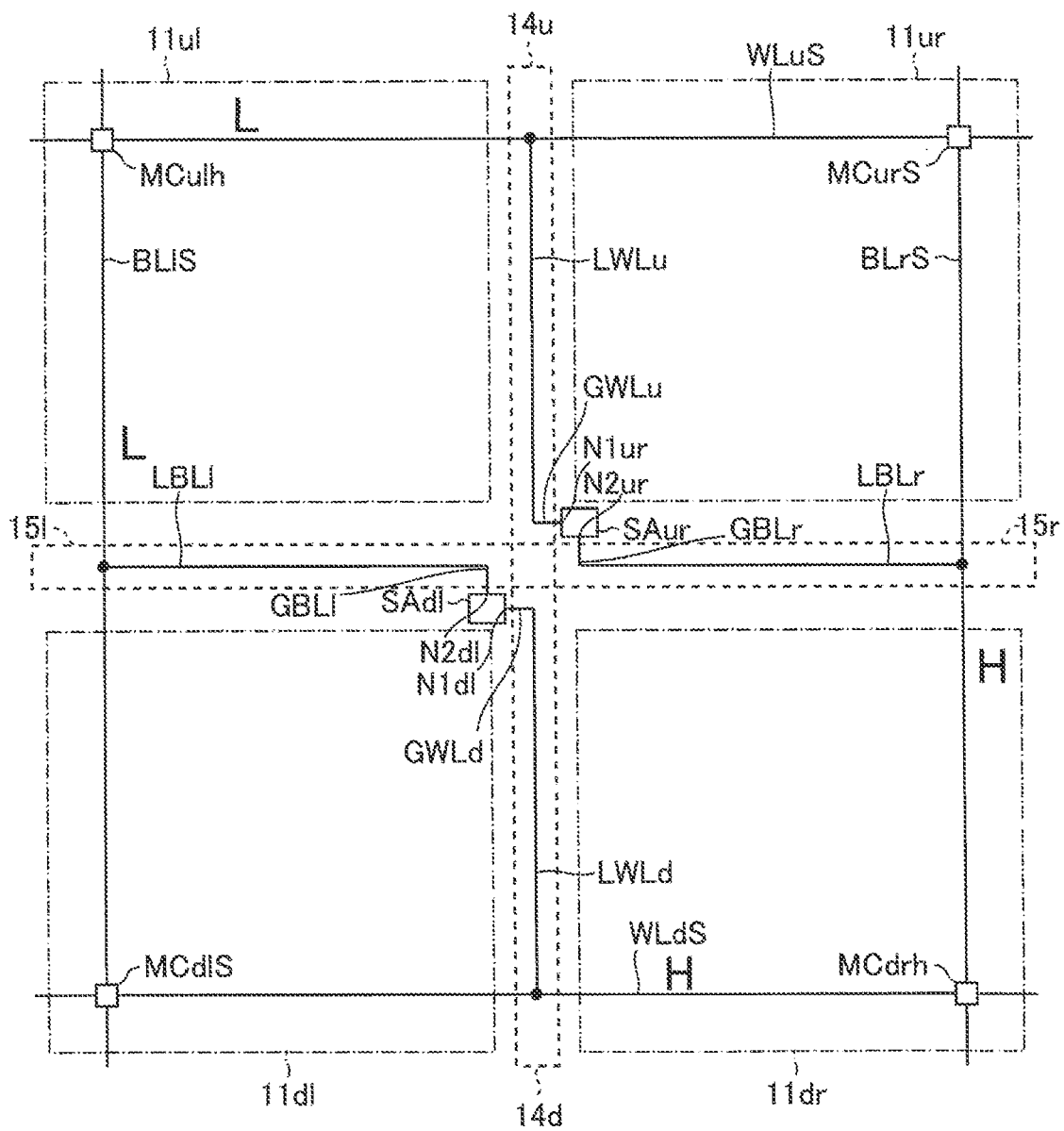
FIG. 14 shows a state of the memory device according to the first embodiment.

In data reading shown in FIG. 13 as well, data reading from the selected upper right memory cell MCurS and the selected lower left memory cell MCdlS is not subject to interference by the resistance states of the upper left memory cell MCul or the lower right memory cell MCdr, as shown in FIG. 14. FIG. 14 shows a state of the memory device according to the first embodiment.

To form the upper-right-memory-cell selected state, a voltage of high level is applied to the selected right bit line BLrS and a voltage of low level is applied to the selected upper word line WLuS. To form the lower-left-memory-cell selected state, a voltage of high level is applied to the selected lower word line WLdS and a voltage of low level is applied to the selected left bit line BLlS. The selected left bit line BLlS applies a voltage of low level to the second node of the upper left memory cell MCul, which may be referred to as a non-selected upper left memory cell MCulh hereinafter, coupled to the selected upper word line WLuS of low level. Therefore, the same voltage is applied to both the terminals of the non-selected upper left memory cell MCulh, and the read current does not flow at all or hardly flows in the non-selected upper left memory cell MCulh.

Similarly, the selected lower word line WLdS applies a voltage of high level to the first node of the lower right memory cell MCdr, which may be referred to as a non-selected lower right memory cell MCdrh hereinafter, coupled to the selected right bit line BLrS of high level. Therefore, the same voltage is applied to both the terminals of the non-selected lower right memory cell MCdrh, and the read current does not flow at all or hardly flows in the non-selected lower right memory cell MCdrh.

1.3. Advantages

Advantageous Effects

According to the first embodiment, as will be described below, it is possible to provide the memory device 1 that can efficiently read data while avoiding an increase in area of each of the row selector 14 and the column selector 15.

Data can be read from the memory cell array 11 including the upper left sub-array 11*ul*, the upper right sub-array 11*ur*, the lower left sub-array 11*dl*, and the lower right sub-array 11*dr*, as follows.

Figure 15:
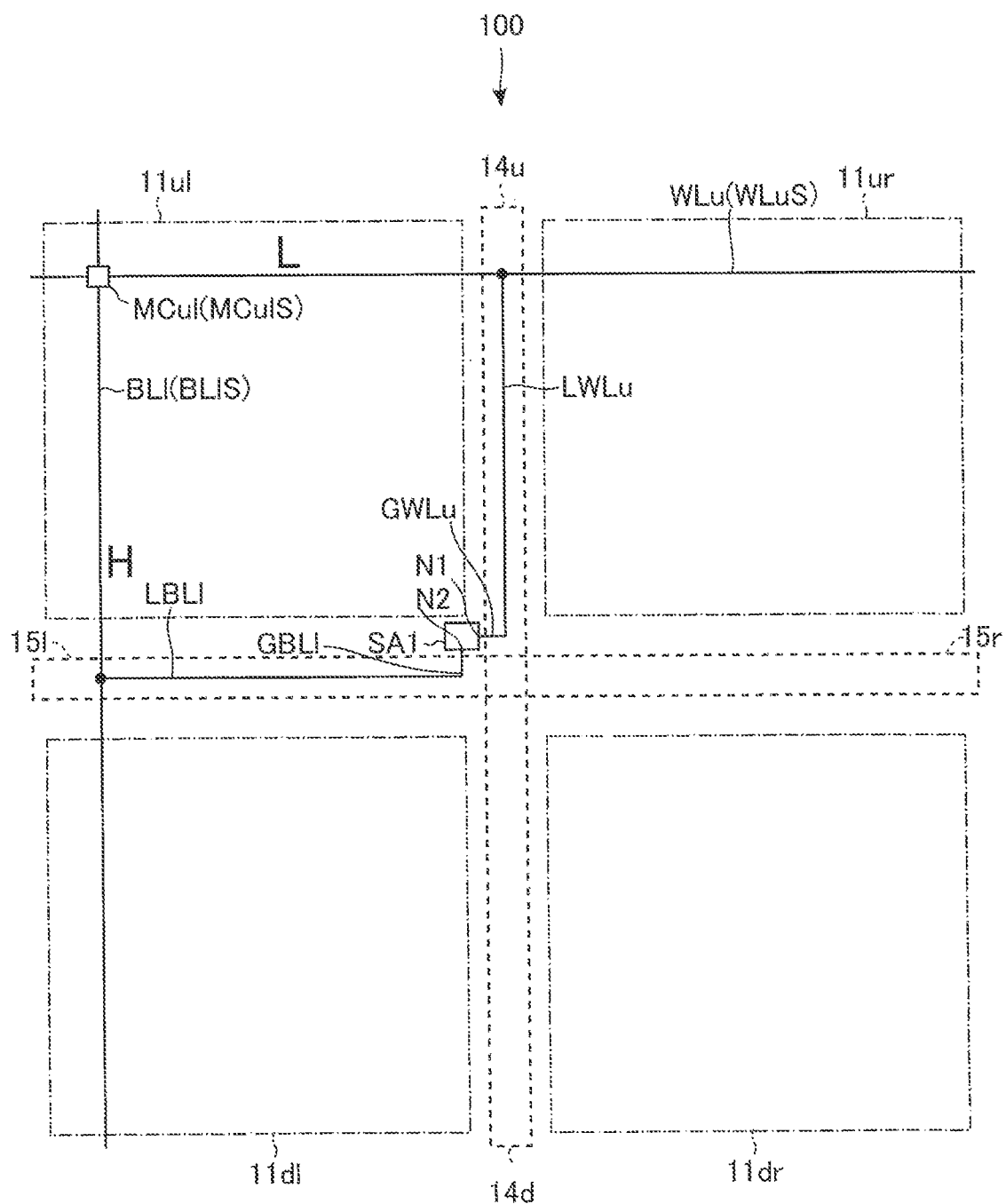
FIG. 15 shows a state during data reading from a memory device according to a first reference.

FIG. 15 shows some components of a memory device 100 and a state during data reading according to a first reference. The memory device 100 includes only a single sense amplifier 41*a* for the memory cell array 11. The sense amplifier 41*a* includes the same components and connections as those of the upper left sense amplifier SAul or the upper right sense amplifier SAur, and supplies the read current Ir from the second node N2 to the first node N1. Since the memory device 100 includes only a single sense amplifier 41, a single data-reading operation can read data from only & single memory cell MC. To make it possible to read data from two memory cells MC by a single data-reading operation, a configuration shown in FIG. 16 can be considered.

Figure 16:
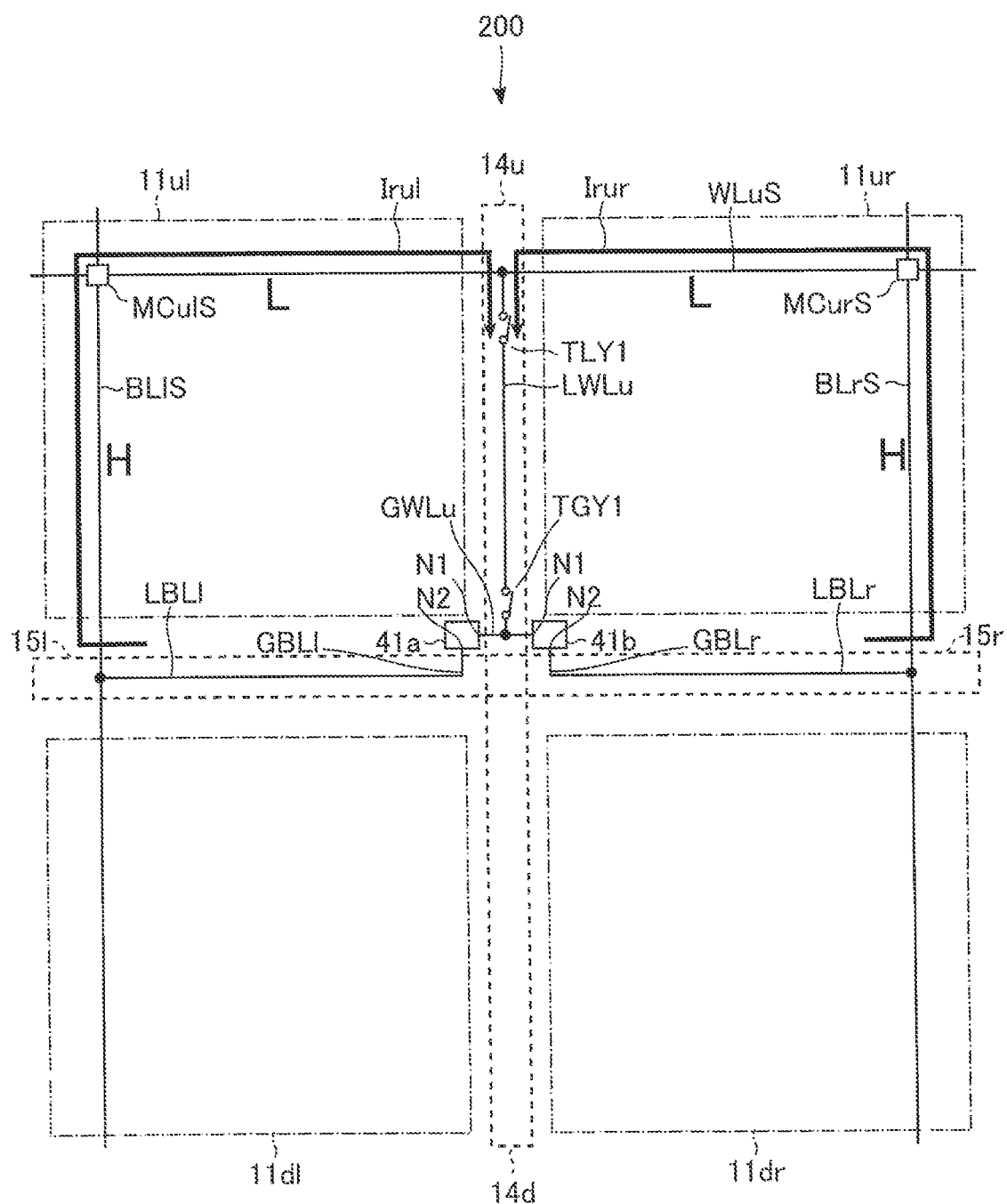
FIG. 16 shows a state during data reading from a memory device according to a second reference.

FIG. 16 shows some components of a memory device 200 and a state during data reading according to a second reference. The memory device 200 includes two sense amplifiers 41*a* and 41*b*. Each of the sense amplifiers 41*a* and 41*b* includes the same components and connections as those of the upper left sense amplifier SAul, and supplies the read current Ir from its second node N2 to its first node N1. The first node N1 of the sense amplifier 41*a* is coupled to the global word line GWLu and the second node N2 of the sense amplifier 41*a* is coupled to the global bit line GBLl. The first node N1 of the sense amplifier 41*b* is coupled to the global word line GWLu and the second node N2 of the sense amplifier 41b is coupled to the global bit line GBLr.

As described with reference to FIG. 7, the plurality of upper word lines WLu share a single local word line LWLu. Therefore, two memory cells MC from which data can be read in parallel need to be coupled to a single upper word line WLu. Data are read from the selected upper left memory cell MCulS and the selected upper right memory cell MCurS that satisfy the above condition. For this purpose, the selected left bit line BLlS and the selected right bit line BLrS are applied with a voltage of high level via the sense amplifiers 41a and 41b, respectively. The selected upper word line WLuS is applied with a voltage of low level via the sense amplifiers 41a and 41b. When the sense amplifiers 41a and 41b are enabled in this state, data can be read from the selected upper left memory cell MCulS and the selected upper right memory cell MCurS.

During data reading, the read current Irul flows from the sense amplifier 41a to the selected upper word line WLuS, and the read current Irur flows from the sense amplifier 41b to the selected upper word line WLuS. Therefore, a current of a magnitude of Irul+Irur, that is, a current of a magnitude which is twice that of the read current Ir flows to the selected upper word line WLuS. To allow the current of such magnitude to flow from the selected upper word line WLuS to the local word line LWLu, a local row switch TLYl playing the same role as that of the local row switch TLYu between each upper word line WLu and the local word line LWLu needs to have capability to conduct (or, drive) a current (current drive capability) which is twice that of the local row switch TLYu having only the drive capability of the current Ir. The current drive capability of a transistor generally depends on the size of the transistor. All the local row switches TLYl need to have a size which is twice that of the local row switch TLYu having only the drive capability of the current Ir. Since the memory device includes several hundred or more than 1,000 local row switches TLYl, the influence of an increase in size is large. Similarly, a global row switch TGYl between the local word line LWLu and the global word line GWLu also needs to have current drive capability which is twice that of the global row switch TGYu.

Figure 17:
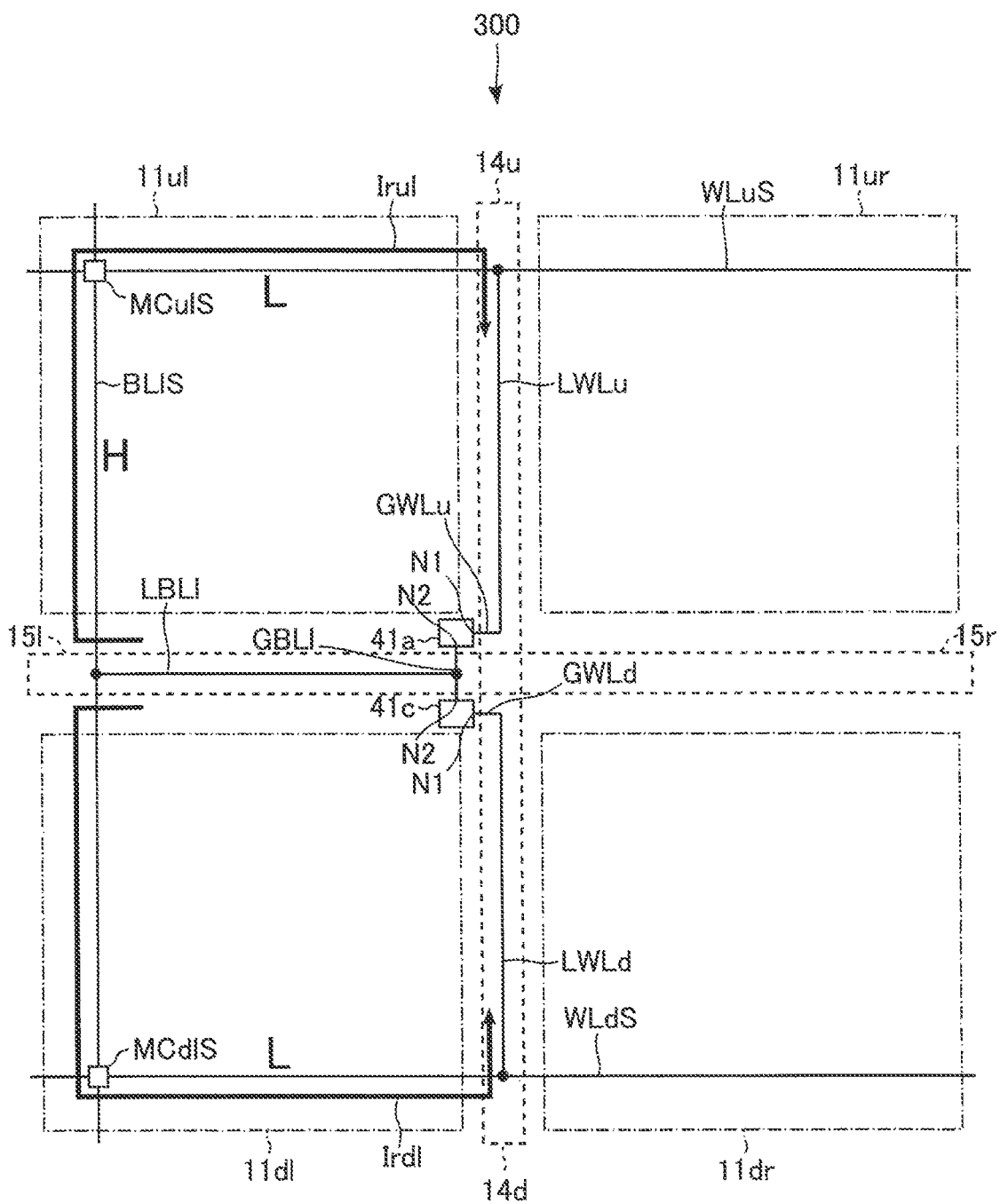
FIG. 17 shows a state during data reading from a memory device according to a third reference.

FIG. 17 shows some components of a memory device 300 and a state during data reading according to a third reference. The memory device 300 includes two sense amplifiers 41a and 41c. The sense amplifier 41c includes the same components and connections as those of the upper left sense amplifier SAul, and supplies the read current Ir from its second node N2 to its first node N1. The first node N1 of the sense amplifier 41c is coupled to the global word line GWLd and the second node N2 of the sense amplifier 41c is coupled to the global bit line GBLl.

The plurality of left bit lines BLl share a single local bit line LBLl. Therefore, two memory cells MC from which data can be read in parallel need to be coupled to a single left bit line BLl. Data are read from the selected upper left memory cell MCulS and the selected lower left memory cell MCdlS that satisfy the above condition. For this purpose, the selected upper word line WLuS and the selected lower word line WLdS are applied with a voltage of low level via the sense amplifiers 41a and 41c, respectively. The selected left bit line BLlS is applied with a voltage of high level via the sense amplifiers 41a and 41c. It is considered that when the sense amplifiers 41a and 41c are enabled in this state, data are read from the selected upper left memory cell MCulS and the selected lower left memory cell MCdlS.

However, since the two selected memory cells MCS are coupled to a single selected left bit line BLlS, reading of data from one of the two selected memory cells MCS is subject to interference of data of the other selected memory cell MCS, and thus data are not read correctly from either of the two selected memory cells MCS.

Figure 18:
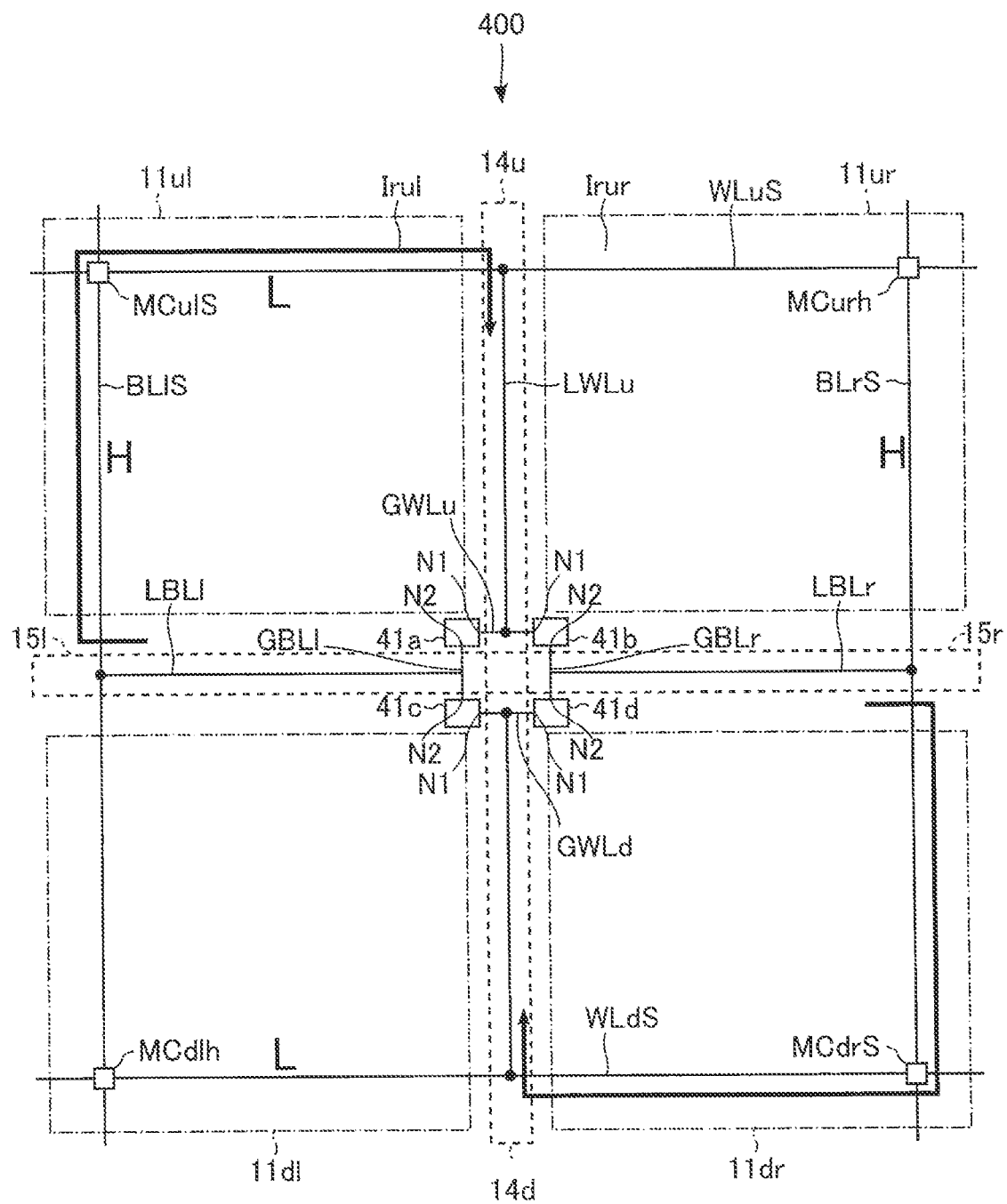
FIG. 18 shows components of a memory device and a stare during data reading according to a fourth reference.

To cope with the above-described problems in the memory devices 200 and 300, a configuration shown in FIG. 18 can be considered. FIG. 18 shows some components of a memory device 400 and a state during data reading according to a fourth reference. The memory device 400 includes two sense amplifiers 41a and 41d. The sense amplifier 41d includes the same components and connections as those of the upper left sense amplifier SAul, and supplies the read current Ir from its second node N2 to its first node N1. The first node N1 of the sense amplifier 41d is coupled to the global word line GWLd and the second node N2 of the sense amplifier 41d is coupled to the global bit line GBLr.

By selecting a single upper left memory cell MCul and a single lower right memory cell MCdr, data can be read from the selected upper left memory cell MCulS and the selected lower right memory cell MCdrS in parallel. To perform such data reading, it is necessary to apply a voltage of high level to the selected left bit line BLlS and the selected right bit line BLrS via the sense amplifiers 41a and 41d, respectively. Furthermore, it is necessary to apply a voltage of low level to the selected upper word line WLuS and the selected lower word line WLdS via the sense amplifiers 41a and 41d, respectively. However, by applying such voltages, the non-selected upper right memory cell MCurh coupled to the selected right bit line BLrS and the selected upper word line WLuS is also set in a selected state. In addition, the non-selected lower left memory cell MCdlh coupled to the selected left bit line BLlS and the selected lower word line WLdS is set in a selected state. Therefore, data reading from the selected upper left memory cell MCulS is subject to interference by a voltage based on the state of the non-selected lower left memory cell MCdlh, and cannot be performed correctly. Similarly, data reading from the selected lower right memory cell MCdrS is subject to interference by a voltage based on the state of the non-selected upper right memory cell MCurh, and cannot be performed correctly.

The memory device 1 according to the first embodiment includes a first sense amplifier SA and a second sense amplifier SA. The first sense amplifier SA supplies, to a first selected memory cell MCS, the read current Ir from a first selected bit line BL of a first bit line group to a first selected word line WL of a first word line group. The second sense amplifier SA supplies, to a second selected memory cell MCS, another read current from a second selected word line WL of a second word line group to a second selected bit line BL of a second bit line group.

As a more detailed example, the upper left sense amplifier SAul is coupled to a selected left bit line BLlS at the second node N2ul and to a selected upper word line WLuS at the first node N1ul, makes the read current Ir flow from the second node N2ul to the first node N1ul, and reads data from the selected upper left memory cell MCulS coupled between the selected left bit line BLlS and the selected upper word line WLuS. Furthermore, the lower right sense amplifier SAdr is coupled to a selected lower word line WLdS at the first node N1dr and to a selected right bit line BLrS at the second node N2dr, and makes the read current Ir flow from the second node N2dr to the first node N1dr, and reads data from the selected lower right memory cell MCdrS coupled between the selected lower word line WLdS and the selected right bit line BLrS. This configuration can form a state (i.e., upper-left-memory-cell selected state) necessary to read data from the selected upper left memory cell MCulS and a state (i.e., lower-right-memory-cell selected state) necessary to read data from the selected lower right memory cell MCdrS without interfering each other. Furthermore, the state necessary to read data from the selected upper left memory cell MCulS and the state necessary to read data from the selected lower right memory cell MCdrS avoid a state, in which data is read from non-selected memory cells MC, from being unintentionally formed. This suppresses inhibition in correct data reading from the selected memory cells MCS. Therefore, it is possible to read correct data from the two selected memory cells MCS in parallel.

2. Second Embodiment

The second embodiment is different from the first embodiment in terms of the number of selected memory cells MCS from which data are read in parallel. The difference from the first embodiment will mainly be described below. Matters that are not mentioned can comply with the description in the first embodiment.

A memory device 1 according to the second embodiment is different from that according to the first embodiment in terms of details of a row selector 14, details of a column selector 15, and control by a control circuit 13. The memory device 1, the row selector 14, and the column selector 15 according to the second embodiment may be referred to as a memory device 1B, a row selector 14B, and a column selector 15B hereinafter to be distinguished from the memory device 1, the row selector 14, and the column selector 15 according to the first embodiment.

2.1. Structure (Configuration)

Figure 19:
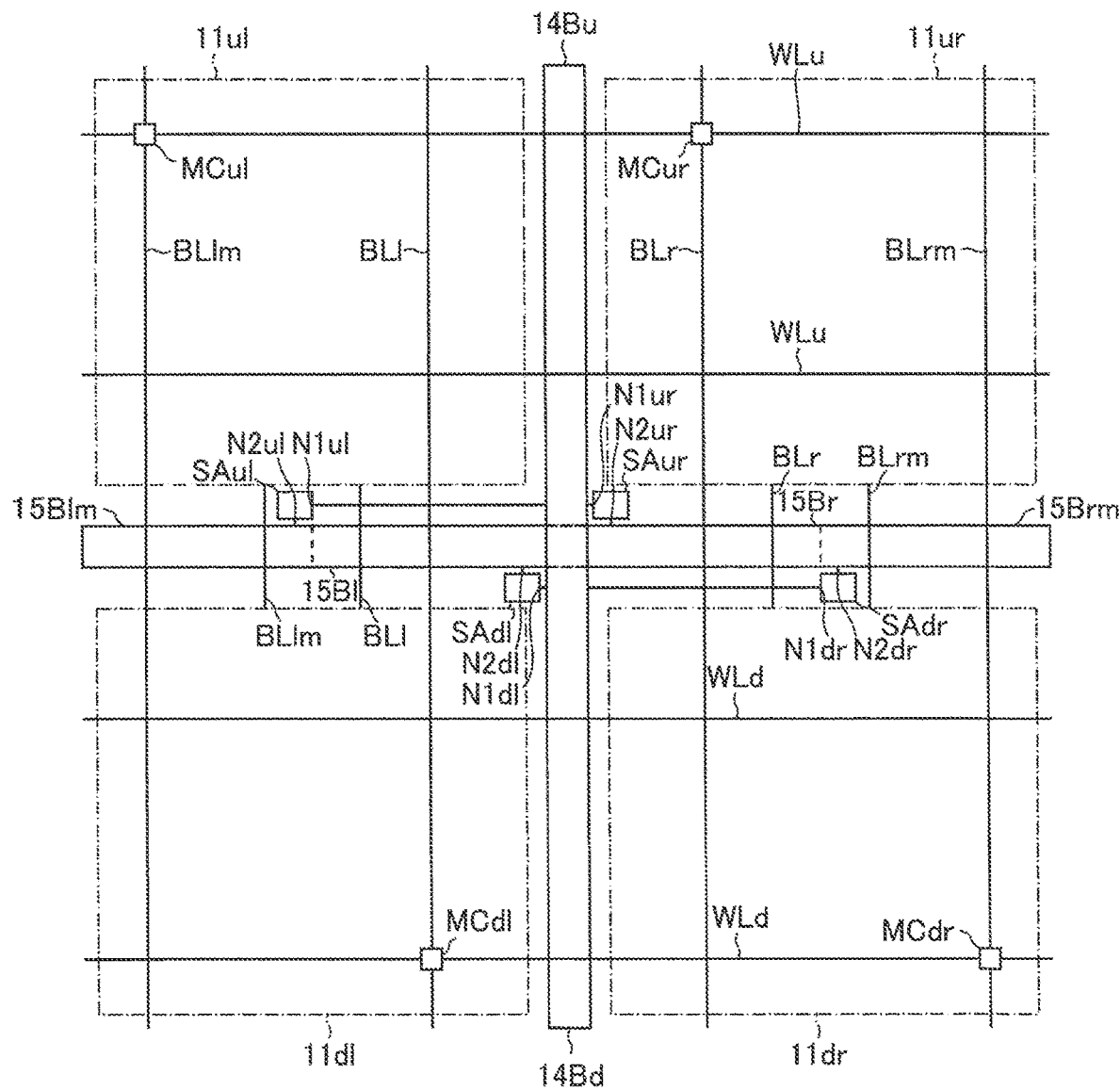
FIG. 19 shows details of some functional blocks of a memory device according to a second embodiment.

FIG. 19 shows details of some functional blocks of the memory device 1B according to the second embodiment. More specifically, FIG. 19 shows components, connections, and layout of part of each of memory cell arrays 11, the row selector 14B, the column selector 15B, and a write circuit 16.

As shown in FIG. 19, an upper left sense amplifier SAul, an upper right sense amplifier SAur, a lower left sense amplifier SAdl, and a lower right sense amplifier SAdr are coupled to components different from those in the first embodiment.

Similar to the row selector 14 of the first embodiment, the row selector 14B includes an upper row selector 14B, and a lower row selector 14Bd.

The column selector 15B corresponds to a configuration in which each of the left column selector 15*l* and the right column selector 15*r* of the first embodiment is divided into two individual portions. The left portion, for example, the left half of the left column selector 15*l* in the first embodiment will be referred to as a left end column selector 15Blm hereinafter and the remaining portion will be referred to as a left column selector 15Bl hereinafter. Similarly, the right portion, for example, the right half of the right column selector 15*r* in the first embodiment will be referred to as a right end column selector 15Brm hereinafter and the remaining portion will be referred to as a right column selector 15Br hereinafter.

The left end column selector 15Blm is coupled to some of left bit lines BLl, which are continuously arrayed, and the left column selector 15Bl is coupled to the remaining left bit lines BLl. For example, left bit lines BLl located in the left half portion among all the left bit lines BLl are coupled to the left end column selector 15Blm, and left bit lines BLl located in the right half portion among all the left bit lines BLl are coupled to the left column selector 15Bl. The left bit lines BLl coupled to the left end column selector 15Blm will be referred to as left end bit lines BLlm hereinafter, and the left bit lines BLl coupled to the left column selector 15Bl will be referred to as left bit lines BLl hereinafter.

The left end column selector 15Blm couples one of the left end bit lines BLlm designated by an address signal ADD to a second node N2*ul* of the upper left sense amplifier SAul. The left column selector 15Bl couples one of the left bit lines BLl designated by the address signal ADD to a second node N2*dl* of the lower left sense amplifier SAdl.

The right end column selector 15Brm is coupled to some of right bit lines BLr, which are continuously arrayed, and the right column selector 15Br is coupled to the remaining right bit lines BLr. For example, right bit lines BLr located in the right half portion among all the right bit lines BLr are coupled to the right end column selector 15Brm, and right bit lines BLr located in the left half portion among all the right bit lines BLr are coupled to the right column selector 15Br. The right bit lines BLr coupled to the right end column selector 15Brm will be referred to as right end bit lines BLrm hereinafter, and the right bit line BLr coupled to the right column selector 15Br will be referred to as right bit lines BLr hereinafter.

The right column selector 15Br receives the address signal ADD, and couples one of the right bit lines BLr designated by the address signal ADD to a second node N2*ur* of the upper right sense amplifier SAur. The right end column selector 15Brm couples one of the right end bit lines BLrm designated by the address signal ADD to a second node N2*dr* of the lower right sense amplifier SAdr.

2.1.1. Details of Column Selector

Figure 20:
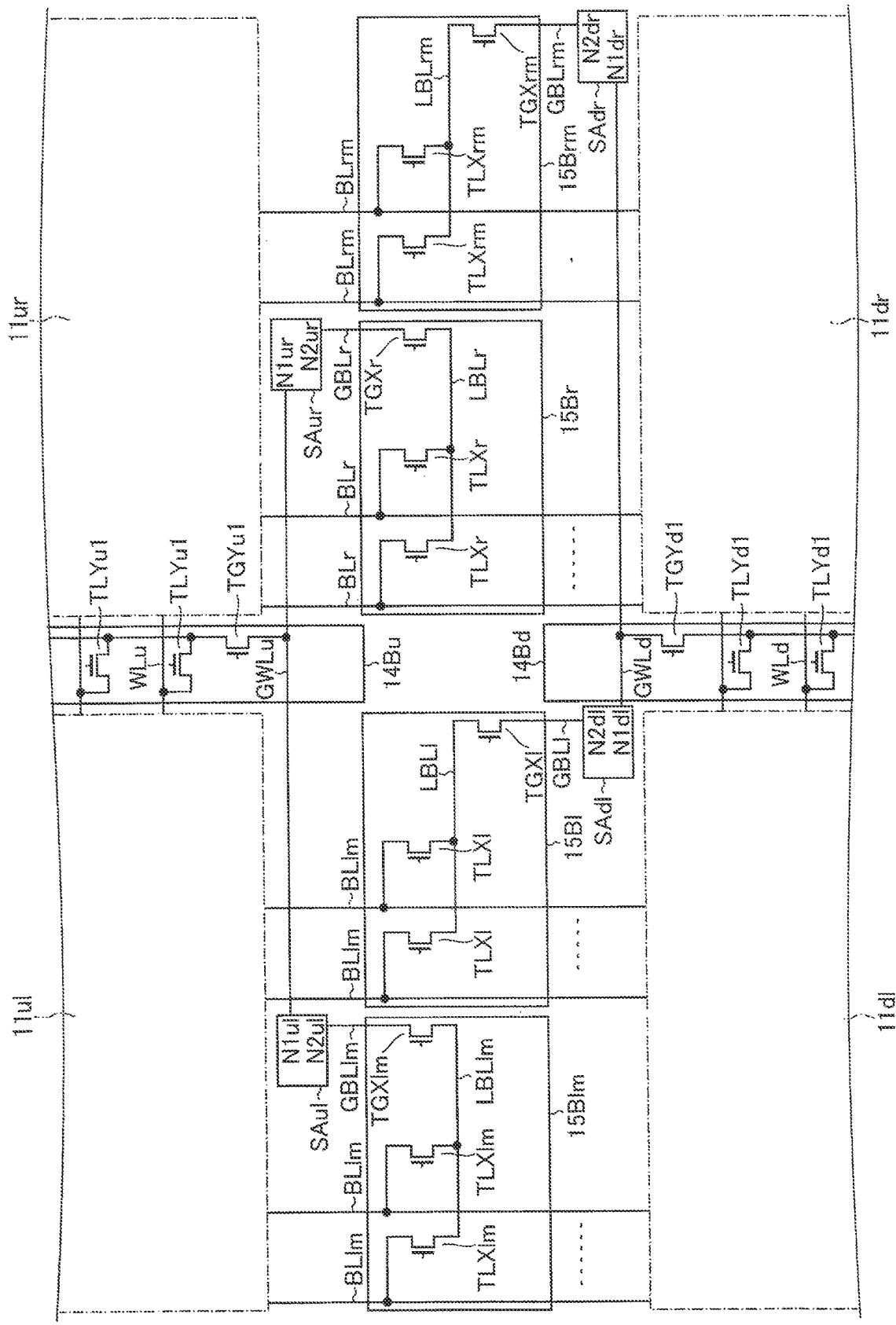
FIG. 20 shows an example of components and connections of a row selector and a column selector according to the second embodiment.

FIG. 20 shows an example of components and connections of the column selector according to the second embodiment.

The upper row selector 14Bu includes not the local row switches TLYu of the first embodiment but local row switches TLYul. The upper row selector 14Bu includes not the global row switch TGYu of the first embodiment but a global row switch TGYul.

The lower row selector 14Bd includes not the local row switches TLYd of the first embodiment but local row switches TLYdl. The lower row selector 14Bd includes not the global row switch TGYd but a global row switches TGYdl.

Each local row switch TLYul is provided instead of each local row switch TLYu in the row selector 14 of the first embodiment. The global row switch TGYul is provided instead of the global row switch TGYu in the row selector 14 of the first embodiment. Each local row switch TLYdl is provided instead of each local row switch TLYd in the row selector 14 of the first embodiment. The global row switch TGYdl is provided instead of the global row switch TGYd in the row selector 14 of the first embodiment.

The local row switches TLYul and TLYdl have current drive capabilities higher than those of the local row switches TLYu and TLYd, respectively. For this purpose, the local row switches TLYul and TLYdl can have sizes (especially, gate widths) larger than sizes (especially, gate widths) of the local row switches TLYu and TLYd, respectively. The local row switches TLYul and TLYdl each have drive capability that can make a current, which is twice the read current Ir, flow.

The global row switches TGYul and TGYdl have current drive capabilities higher than those of the global row switches TGYu and TGYd, respectively. For this purpose, the global row switches TGYul and TGYdl can have sizes (especially, gate widths) larger than sizes (especially, gate widths) of the global row switches TGYu and TGYd, respectively. The global row switches TGYul and TGYdl each have at least, drive capability that can make a current, which is twice the read current Ir, flow.

Each of the left end column selector 15Blm, the left column selector 15Bl, the right column selector 15Br, and the right end column selector 15Brm has the same configuration and function as those of the left column selector 15*l* or the right column selector 15*r* of the first embodiment. That is, each of the left end column selector 1531*m*, the left column selector 15Bl, the right column selector 15Br, and the right end column selector 15Brm includes a set of the plurality of local column switches, the local bit line, the global column switch, and the global bit line. These sets are independent of each other. In each of the left end column selector 15Blm, the left column selector 15Bl, the right column selector 15Br, and the right end column selector 15Brm, the plurality of local column switches, the local bit line, the global column switch, and the global bit line are coupled, similarly to those in the left column selector 15*l* or the right column selector 15*r* of the first embodiment. Details are as follows.

The left end column selector 15Blm includes a plurality of local column switches TLXlm, a local bit line LBLlm, a global column switch TGXlm, and a global bit line GBLlm. Each local column switch TLXlm is coupled between a single left end bit line BLlm and the local bit line LBLlm. Similar to the local column switch TLXl of the first embodiment, each local column switch TLXlm receives a control signal LXl unique to the local column switch TLXlm at its control terminal. The local bit line LBLlm is coupled to the global bit line GBLlm via the global column switch TGXlm. The global column switch TGXlm receives a control signal GXl at its control terminal. When a local column switch TLXlm and the global column switch TGXlm are turned on, a single left end bit line BLlm can be coupled to the second node N2*ul* of the upper left sense amplifier SAul.

The left column selector 15*l* includes a plurality of local column switches TLXl, a local bit line LBLl, a global column switch TGXl, and a global bit line GBLl. Each local column switch TLXl is coupled between a single left bit line BLl and the local bit line LBLl. Similar to the local column switch TLXl of the first embodiment, each local column switch TLXl receives the control signal LXl unique to the local column switch TLXl at its control terminal. The local bit line LBLl is coupled to the global bit line GBLl via the global column switch TGXl. The global column switch TGXl receives the control signal GXl at its control terminal. When a local column switch TLXl and the global column switch TGXl are turned on, a single left bit line BLl can be coupled to the second node N2*dl* of the lower left sense amplifier SAdl.

The right column selector 15*r* includes a plurality of local column switches TLXr, a local bit line LBLr, a global column switch TGXr, and a global bit line GBLr. Each local column switch TLXr is coupled between a single right bit line BLr and the local bit line LBLr. Similar to the local column switch TLXr of the first embodiment, each local column switch TLXr receives a control signal LXr unique to the local column switch TLXr at its control terminal. The local bit line LBLr is coupled to the global bit line GBLr via the global column switch TGXr. The global column switch TGXr receives a control signal GXr at its control terminal. When a local column switch TLXr and the global column switch TGXr are turned on, a single right bit line BLr can be coupled to the second node N2*ur* of the upper right sense amplifier SAur.

The right end column selector 15Brm includes a plurality of local column switches TLXrm, a local bit line LBLrm, a global column switch TGXrm, and a global bit line GBLrm. Each local column switch TLXrm is coupled between a single right end bit line BLrm and the local bit line LBLrm. Similar to the local column switch TLXr of the first embodiment, each local column switch TLXrm receives the control signal LXr unique to the local column switch TLXrm at its control terminal. The local bit line LBLrm is coupled to the global bit line GBLrm via the global column switch TGXrm. The global column switch TGXrm receives the control signal GXr at its control terminal. When a local column switch TLXrm and the global column switch TGXrm are turned on, a single right end bit line BLrm can be coupled to the second node N2*dr* of the lower right sense amplifier SAdr.

2.2. Operation

Figure 21:
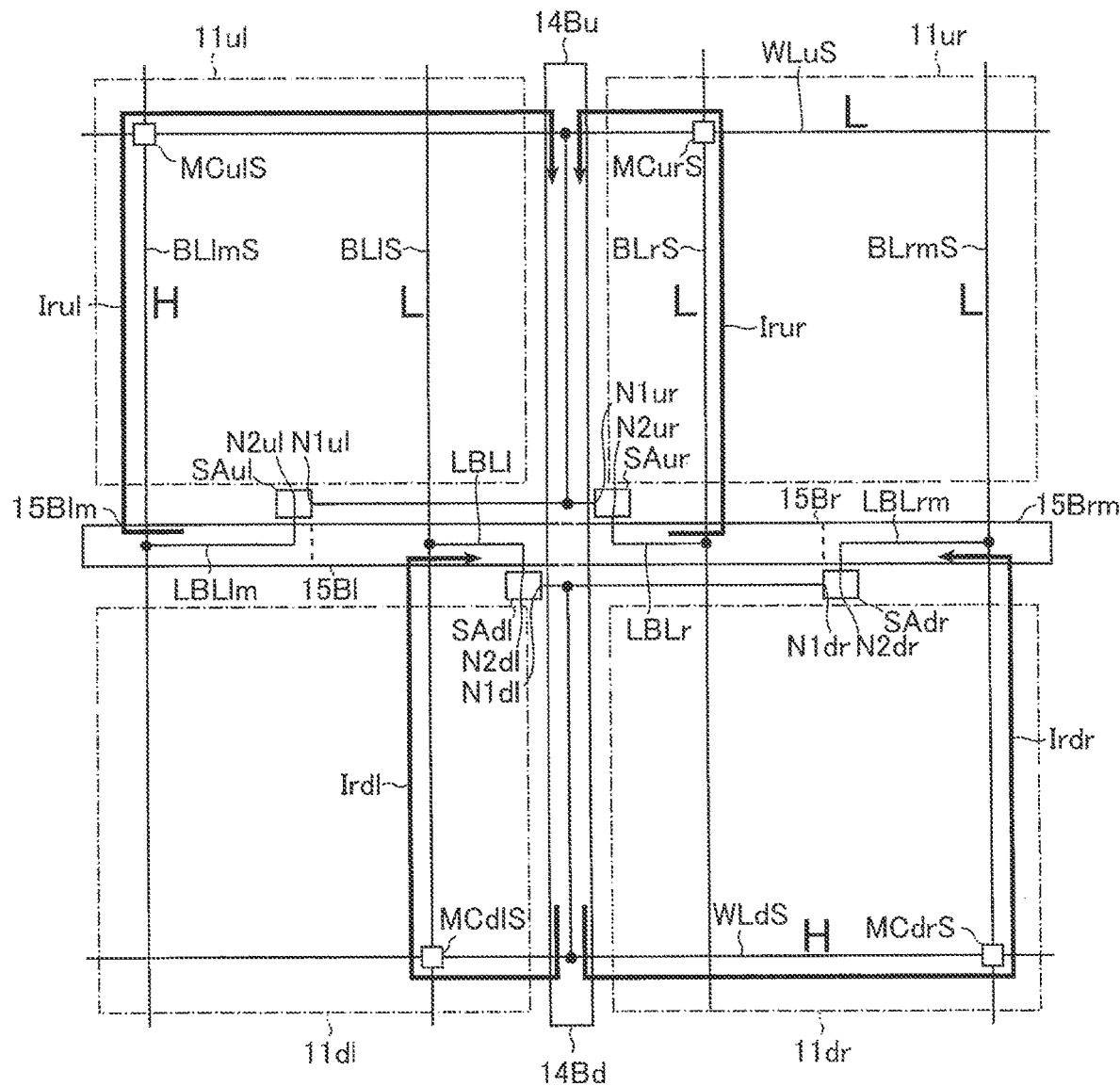
FIG. 21 shows a state during data reading from the memory device according to the second embodiment.

FIG. 21 shows a state during data reading from the memory device 1 according to the second embodiment. FIG. 21 shows the same range as in FIG. 19, and represents the layout, similarly to FIG. 19.

The memory device 1B reads data from four memory cells MC in total of an upper left sub-array 11*ul*, an upper right sub-array 11*ur*, a lower left sub-array 11*dl*, and a lower right sub-array 11*dr* in parallel. That is, the memory device 1B reads data from a selected upper left memory cell MCulS, a selected upper right memory cell MCurS, a selected lower left memory cell MCdlS, and a selected lower right memory cell MCdrS in parallel. FIG. 21 shows only components associated with data reading from the selected upper left memory cell MCulS, the selected upper right memory cell MCurS, the selected lower left memory cell MCdlS, and the selected lower right memory cell MCdrS. An overview of data reading in the second embodiment corresponds to or is similar to a case in which parallel data reading (FIG. 11) from the selected upper left memory cell MCulS and the selected lower right memory cell MCdrS and parallel data reading (FIG. 13) from the selected upper right memory cell MCurS and the selected lower left memory cell MCdlS in parallel occur in parallel.

The selected upper left memory cell MCulS and the selected upper right memory cell MCurS need to be coupled to the same upper word line WLu. The selected lower left memory cell. MCdlS and the selected lower right memory cell MCdrS need to be coupled to the same lower word line WLd. Data can be read in parallel from four memory cells MC that satisfy the above condition.

A left end bit line BLlm which is coupled to the selected upper left memory cell MCulS will be referred to as a selected left end bit line BLlmS hereinafter. A left bit line BLl which is coupled to the selected lower left memory cell MCdlS will be referred to as a selected left bit line BLlS hereinafter. A right bit line BLr which is coupled to the selected upper right memory cell MCurS will be referred to as a selected right bit line BLrS hereinafter. A right end bit line BLrm which is coupled to the selected lower right memory cell MCdrS will be referred to as a selected right end bit line BLrmS hereinafter.

Similar to the method according to the first embodiment, an upper-left-memory-cell selected state, an upper-right-memory-cell selected state, a lower-left-memory-cell selected state, and a lower-right-memory-cell selected state are formed. Details can be estimated from the description of the first embodiment, and an overview is as follows.

A selected upper word line WLuS is coupled to a first node N1*ul* of the upper left sense amplifier SAul and a first node N1*ur* of the upper right sense amplifier SAur via a local row switch TLYul (not shown) which is coupled to the selected upper word line WLuS and is ON and the global row switch TGYul (not shown).

A selected lower word line WLdS is coupled to a first node N1*dl* of the lower left sense amplifier SAdl and a first node N1*dr* of the lower right sense amplifier SAdr via a local row switch TLYdl (not shown) which is coupled to the selected lower word line WLdS and is ON and the global row switch TGYd (not shown).

The selected left end bit line BLlmS is coupled to the second node N2*ul* of the upper left sense amplifier SAul via a local column switch TLXlm (not shown) which is coupled to the selected left end bit line BLlmS and is ON and the global column switch TGXlm (not shown).

The selected left bit line BLlS is coupled to the second node N2*dl* of the lower left sense amplifier SAdl via a local column switch TLXl (not shown) which is coupled to the selected left bit line BLlS and are ON and the global column switch TGXl (not shown).

The selected right bit line BLrS is coupled to the second node N2*ur* of the upper right sense amplifier SAur via a local column switch TLXr (not shown) which is coupled to the selected right bit line BLrS and is ON and the global column switch TGXr (not shown).

The selected right end bit line BLrmS is coupled to the second node. N2*dr* of the lower right sense amplifier SAdr via a local column switch TLXrm (not shown) which is coupled to the selected right end bit line BLrmS and is ON and the global column switch TGXrm (not shown).

In a state in which the upper-left-memory-cell selected state, the upper-right-memory-cell selected state, the lower-left-memory-cell selected state, and the lower-right-memory-cell selected state are formed, as described above, the upper left, sense amplifier SAul, the upper right sense amplifier SAur, the lower left sense amplifier SAdl, and the lower right sense amplifier SAdr are enabled, similarly to the first embodiment. This starts to read data from the selected upper left memory cell MCulS, the selected upper right memory cell MCurS, the selected lower left memory cell MCdlS, and the selected lower right memory cell MCdrS.

Along the start of data reading, each interconnect associated with data reading is applied with a voltage, as follows. A voltage of low level is applied to the selected upper word line WLuS. A voltage of high level is applied to the selected lower word line WLdS. A voltage of high level is applied to the selected left end bit line BLlmS. A voltage of low level is applied to the selected left bit line BLlS. A voltage of low level is applied to the selected right bit line BLrS. A voltage of low level is applied to the selected right end bit line BLrmS.

The application of voltages for data reading makes it possible to prevent data reading from the selected upper left memory cell MCulS, that from the selected upper right memory cell MCurS, that from the selected lower left memory cell MCdlS, and that from the selected lower right memory cell MCdrS from interfering each other. Therefore, it is possible to obtain read data, as follows.

A read current Irul flows from the selected left end bit line BLlmS to the selected upper word line WLuS through the selected upper left memory cell MCulS. The upper left sense amplifier SAul outputs a voltage reflecting the resistance state of the selected upper left memory cell MCulS. This voltage corresponds to data read from the selected upper left memory cell MCulS.

A read current Irur flows from the selected right bit line BLrS to the selected upper word line WLuS through the selected upper right memory cell MCurS. The upper right sense amplifier SAur outputs a voltage reflecting the resistance state of the selected upper right memory cell MCurS. This voltage corresponds to data read from the selected upper right memory cell MCurS.

A read current Irdl flows from the selected lower word line WLdS to the selected left bit line BLlS through the selected lower left memory cell MCdlS. The lower left sense amplifier SAdl outputs a voltage reflecting the resistance state of the selected lower left memory cell MCdlS. This voltage corresponds to data read from the selected lower left memory cell MCdlS.

A read current Irdr flows from the selected lower word line WLdS to the selected right end bit line BLrmS through the selected lower right memory cell MCdrS. The lower right sense amplifier SAdr outputs a voltage reflecting the resistance state of the selected lower right memory cell MCdrS. This voltage corresponds to data read from the selected lower right memory cell MCdrS.

By performing data reading, a current of a magnitude of 2×Ir can flow through the local row switch TLYul (not shown) and the global row switch TGYul (not shown) coupled to the selected upper word line WLuS. Furthermore, a current of a magnitude of 2×Ir can flow through the local row switch TLYdl (not shown) and the global row switch TGYdl (not shown) coupled to the selected lower word line WLdS.

2.3. Advantages (Advantageous Effects)

It may be possible to provide a local row switch having large current drive capability, like the local row switches TLYul and TLYdl. In this case, according to the second embodiment, it is possible to read correct data from four memory cells MC in parallel, as will be described below.

Similar to the first embodiment, the memory device 1B includes a first sense amplifier SA and a second sense amplifier SA. The first sense amplifier SA supplies, to a first selected memory cell MCS, the read current Ir from a first selected bit line BLS of a first bit line group to a first selected word line WLS of a first word line group. The second sense amplifier SA supplies, to a second selected memory cell MCS, another read current Ir from a second selected word line WLS of a second word line group to a second selected bit line BLS of a second bit line group.

Furthermore, the memory device 1B includes a third sense amplifier SA and a fourth sense amplifier SA. The third sense amplifier SA supplies, to a third selected memory cell MCS, the read current Ir from a third selected bit line BLS of the third bit line group to the first selected word line WLS. The fourth sense amplifier SA supplies, to a fourth selected memory cell MCS, another read current Ir from the second selected word line WLS to a fourth selected bit line BLS of a fourth bit line group.

States necessary to read data from the first to fourth selected memory cells MCS, respectively, can be formed without interfering each other. Therefore, it is possible to read correct data from the four memory cells MC in parallel.

2.4. Modification

The example corresponding to the configuration in which each of the left column selector 15*l* and the right, column selector 15*r* of the first embodiment is divided into two individual portions has been described. However, the second embodiment is not limited to this. That is, each of the left column selector 15*l* and the right column selector 15*r* of the first embodiment may be divided in to three or more individual portions.

3. Modification

Each of the upper left sense amplifier SAul, the upper right sense amplifier SAur, the lower left sense amplifier SAdl, and the lower right sense amplifier SAdr may have both a function of supplying the read current Ir from its first node N1 and drawing the read current Ir from its second node N2, and a function of supplying the read current Ir from its second node N2 and drawing the read current Ir from its first node N1. That is, each sense amplifier SA includes both the configuration shown in FIG. 8 and the configuration shown in FIG. 9 or 10, and may be configured to dynamically select one of the configuration shown in FIG. 8 and the configuration shown in FIG. 9 or 10.

The variable resistance element VR may include a phase change element, a ferroelectric element, or another element. The phase change element is used for a phase change random access Memory (PCRAM) is set in a crystal state or amorphous state by heat generated by the write current, thereby exhibiting a different resistance value depending on the state. The variable resistance element VR may include an element used for an resistive RAM (ReRAM). For such variable resistance element VR, the resistance value of the variable resistance element VR changes depending on the width (pulse application period) or amplitude (current value or voltage value) of a write pulse and application of the polarity (application direction) of the write pulse.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions.

What is claimed is:

1. A variable resistance memory device comprising:
a first interconnect;
a second interconnect;
a third interconnect;
a fourth interconnect;
a first memory cell coupled to the first interconnect and the third interconnect and having a variable resistance;
a second memory cell coupled to the second interconnect and the fourth interconnect and having a variable resistance;
a first sense amplifier having a first terminal and a second terminal and having a potential difference between the first terminal and the second terminal, the first terminal being coupled to the first interconnect and a node of a first potential, and the second terminal being located closer than the first terminal to a node of a second potential and coupled to the third interconnect; and
a second sense amplifier having a third terminal and a fourth terminal and having a potential difference between the third terminal and the fourth terminal, the third terminal being coupled to the fourth interconnect and a node of a third potential, and the fourth terminal being located closer than the third terminal to a node of a fourth potential and coupled to the second interconnect.

2. The device of claim 1, wherein
the first sense amplifier is configured to output a voltage based on a voltage of the second terminal, and the second sense amplifier is configured to output a voltage based on a voltage of the fourth terminal.

3. The device of claim 1, wherein
the first sense amplifier is configured to output a voltage based on a voltage of the second terminal, and
the second sense amplifier is configured to output a voltage based on a voltage of the third terminal.

4. The device of claim 1, wherein
the first sense amplifier is configured to output a first current from the second terminal and draw the first current at the first terminal, and
the second sense amplifier is configured to output a second current from the fourth terminal and draw the second current at the third terminal.

5. The device of claim 1, wherein the first sense amplifier and the second sense amplifier are enabled in parallel.

6. The device of claim 1, further comprising:
a first memory cell array including the first memory cell;
a second memory cell array;
a third memory cell array;
a fourth memory cell array including the second memory cell;
a first circuit located between the first memory cell array and the second memory cell array and including a first switch between the first terminal and the first interconnect;
a second circuit located between the first memory cell array and the third memory cell array and including a second switch between the second terminal and the third interconnect;
a third circuit located between the third memory cell array and the fourth memory cell array and including a third switch between the fourth terminal and the second interconnect; and
a fourth circuit located between the second memory cell array and the fourth memory cell array and including a fourth switch between the third terminal and the fourth interconnect.

7. The device of claim 1, further comprising:
a third memory cell coupled to the first interconnect and the fourth interconnect and having a variable resistance; and
a fourth memory cell coupled to the third interconnect and the second interconnect and having a variable resistance.

8. The device of claim 7, further comprising:
a first memory cell array including the first memory cell;
a second memory cell array including the third memory cell;
a third memory cell array including the fourth memory cell;
a fourth memory cell array including the second memory cell;
a first circuit located between the first memory cell array and the second memory cell array and including a first switch between the first terminal and the first interconnect;
a second circuit located between the first memory cell array and the third memory cell array and including a second switch between the second terminal and the third interconnect;
a third circuit located between the third memory cell array and the fourth memory cell array and including a third switch between the fourth terminal and the second interconnect; and a fourth circuit located between the second memory cell array and the third memory cell array and including a fourth switch between the third terminal and the fourth interconnect.

9. The device of claim 7, further comprising:

a third sense amplifier having a fifth terminal and a sixth terminal, the fifth terminal being coupled to a node of a fifth potential and the first interconnect, and the sixth terminal being located closer than the fifth terminal to a node of a sixth potential higher than the fifth potential and coupled to the fourth interconnect; and a fourth sense amplifier having a seventh terminal and an eighth terminal, the seventh terminal being coupled to a node of a seventh potential and the third interconnect, and the eighth terminal being located closer than the seventh terminal to a node of an eighth potential higher than the seventh potential and coupled to the second interconnect.

10. The device of claim 1, further comprising:

a fifth interconnect;

a sixth interconnect;

a third memory cell coupled to the first interconnect and the fifth interconnect and having a variable resistance;

a fourth memory cell coupled to the sixth interconnect and the second interconnect and having a variable resistance;

a third sense amplifier having a fifth terminal, and a sixth terminal, the fifth terminal being coupled to a node of a fifth potential and the first interconnect, and the sixth terminal being located closer than the fifth terminal to a node of a sixth potential higher than the fifth potential and coupled to the fifth interconnect; and a fourth sense amplifier having a seventh terminal and an eighth terminal, the seventh terminal being coupled to a node of a seventh potential and the sixth interconnect, and the eighth terminal being located closer than the seventh terminal to a node of an eighth potential higher than the seventh potential and coupled to the second interconnect.

11. The device of claim 10, wherein the first sense amplifier, the second sense amplifier, the third sense amplifier, and the fourth sense amplifier are enabled simultaneously.

12. The device of claim 10, further comprising:

a first memory cell array including the first memory cell;

a second memory cell array including the third memory cell;

a third memory cell array including the fourth memory cell;

a fourth memory cell array including the second memory cell;

a first circuit located between the first memory cell array and the second memory cell array and including a first switch between the first terminal and the fifth terminal and the first interconnect;

a second circuit located between the first memory cell array and the third memory cell array and including a second switch between the second terminal and the third interconnect;

a third circuit located between the first memory cell array and the third memory cell array and including a third switch between the seventh terminal and the sixth interconnect;

a fourth circuit located between the third memory cell array and the fourth memory cell array and including a fourth switch between the fourth terminal and the eighth terminal and the second interconnect;

a fifth circuit located between the second memory cell array and the fourth memory cell array and including a fifth switch between the sixth terminal and the fifth interconnect; and a sixth circuit located between the second memory cell array and the fourth memory cell array and including a sixth switch between the third terminal and the fourth interconnect.

* * * * *